(12) United States Patent
Yun et al.

(10) Patent No.: US 12,428,578 B2
(45) Date of Patent: Sep. 30, 2025

(54) WINDOW, DISPLAY APPARATUS, AND METHOD OF MANUFACTURING WINDOW

(71) Applicant: Samsung Display Co., Ltd., Yongin-si (KR)

(72) Inventors: Hyunkyung Yun, Yongin-si (KR); Jihyun Ko, Yongin-si (KR); Hyunseung Seo, Yongin-si (KR); Dongsung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 663 days.

(21) Appl. No.: 17/669,037

(22) Filed: Feb. 10, 2022

(65) Prior Publication Data

US 2022/0282113 A1 Sep. 8, 2022

(30) Foreign Application Priority Data

Mar. 2, 2021 (KR) ........................ 10-2021-0027493

(51) Int. Cl.
| | |
|---|---|
| *C09D 135/02* | (2006.01) |
| *B05D 7/00* | (2006.01) |
| *C08J 7/04* | (2020.01) |
| *C09D 7/00* | (2018.01) |
| *C09D 7/20* | (2018.01) |
| *C09D 127/12* | (2006.01) |
| *G02B 1/14* | (2015.01) |
| *H05K 5/03* | (2006.01) |

(52) U.S. Cl.
CPC ........... *C09D 135/02* (2013.01); *B05D 7/544* (2013.01); *C08J 7/042* (2013.01); *C09D 7/00* (2013.01); *C09D 7/20* (2018.01); *C09D 127/12* (2013.01); *G02B 1/14* (2015.01); *H05K 5/03* (2013.01); *C08J 2327/16* (2013.01); *C08J 2333/12* (2013.01); *C08J 2367/02* (2013.01); *C08J 2369/00* (2013.01); *C08J 2379/08* (2013.01); *C08J 2427/12* (2013.01); *C08J 2435/02* (2013.01)

(58) Field of Classification Search
None
See application file for complete search history.

(56) References Cited

U.S. PATENT DOCUMENTS

| | | | |
|---|---|---|---|
| 10,174,222 B2 * | 1/2019 | Park | .................. H10K 77/111 |
| 10,908,746 B2 | 2/2021 | Seo et al. | |
| 2006/0227695 A1 | 10/2006 | Nagaoka | |
| 2008/0241524 A1 | 10/2008 | Fukuda et al. | |
| 2017/0022342 A1 | 1/2017 | Kim et al. | |
| 2017/0253706 A1 | 9/2017 | Lim et al. | |
| 2018/0106929 A1 * | 4/2018 | Song | ..................... B05D 3/067 |
| 2018/0201000 A1 | 7/2018 | Kim et al. | |
| 2021/0223453 A1 | 7/2021 | Seo et al. | |

FOREIGN PATENT DOCUMENTS

| | | | |
|---|---|---|---|
| JP | 2005-004163 | A | 1/2005 |
| KR | 10-2008-0088479 | A | 10/2008 |
| KR | 10-1168073 | B1 | 7/2012 |
| KR | 10-2015-0062865 | A | 6/2015 |
| KR | 10-2017-0103646 | A | 9/2017 |
| KR | 10-2017-0016299 | A | 12/2017 |
| KR | 10-2018-0001692 | A | 1/2018 |
| KR | 10-2019-0052730 | A | 5/2019 |
| KR | 10-2039737 | B1 | 11/2019 |
| KR | 10-2181559 | B1 | 11/2020 |

\* cited by examiner

*Primary Examiner* — Cheng Yuan Huang
(74) *Attorney, Agent, or Firm* — Womble Bond Dickinson (US) LLP

(57) ABSTRACT

A window may include a substrate layer and a coating layer on the substrate layer. The coating layer may include water molecules.

12 Claims, 17 Drawing Sheets

WINDOW, DISPLAY APPARATUS, AND METHOD OF MANUFACTURING WINDOW

CROSS-REFERENCE TO RELATED APPLICATION

This application claims priority to and the benefit of Korean Patent Application No. 10-2021-0027493, filed on Mar. 2, 2021, in the Korean Intellectual Property Office (KIPO), the entire disclosure of which is incorporated by reference herein.

BACKGROUND

1. Field

Embodiments of the present disclosure relate to an apparatus and a method, and more particularly, to a window, a display apparatus, and a method of manufacturing a window.

2. Description of the Related Art

Mobile electronic devices are widely used. Tablet PCs have been widely used in recent years as mobile electronic devices in addition to small electronic devices such as mobile phones.

Such mobile electronic devices include display apparatuses that provide a user with visual information such as images or pictures in order to support various functions. Recently, as other components for driving display apparatuses have been downsized, the proportion occupied by display apparatuses in electronic devices is gradually increasing, and a structure capable of being bent from a flat state to have a certain angle is also being developed.

SUMMARY

Generally, in a display apparatus, a window is manufactured to protect a display panel from an external impact. When the window is manufactured, warpage may occur according to properties of materials and contraction of each layer.

Aspects of one or more embodiments of the present disclosure are directed toward a window with reduced warpage, a display apparatus, and a method of manufacturing a window.

Additional aspects will be set forth in part in the description which follows and, in part, will be apparent from the description, or may be learned by practice of the presented embodiments of the present disclosure.

An embodiment of the present disclosure may include a window including a substrate layer and a coating layer on the substrate layer, the coating layer including water molecules.

The coating layer may include a first coating layer on the substrate layer and a second coating layer on the first coating layer.

The first coating layer and the second coating layer may include an acrylic polymer including at least one of trimethylolpropane triacrylate, ethoxylated (3 mol) trimethylol propane triacrylate, ethoxylated (6 mol) trimethylol propane triacrylate, propoxylated (3 mol) trimethylol propane triacrylate (TMPTA), or pentaerythritol triacrylate (PETA).

The second coating layer may include a fluorine-based compound.

The first coating layer may include inorganic nanoparticles.

A thickness of the second coating layer may be less than a thickness of the first coating layer.

A thickness of the first coating layer may be in a range of 30 μm or more and 40 μm or less.

A thickness of the second coating layer may be in a range of 1 μm or more and 10 μm or less.

The substrate layer may include a plurality of body layers stacked on each other (e.g., stacked upon one another).

The substrate layer may include at least one of polycarbonate, polymethyl methacrylate, polyethylene terephthalate, polyimide, or poly-vinylidene fluoride.

A transmittance of the window may be 90% or more.

A yellowness index of the window may be 1 or less.

A warpage of the window may be in a range of −0.5 mm to 0.5 mm.

Another embodiment of the present disclosure may include a window and a display panel coupled to the window.

Another embodiment of the present disclosure may include a method of manufacturing a window, the method including forming a hard coating layer including a first coating layer and a second coating layer, the first coating layer and the second coating layer being sequentially stacked on a substrate layer, and penetrating water molecules into at least one of the first coating layer or the second coating layer.

The forming of the hard coating layer may include coating a first coating composition on the substrate layer, precuring the first coating composition to form a precured first coating composition, coating a second coating composition on the precured first coating composition, and forming the first coating layer and the second coating layer by curing the precured first coating composition and the second coating composition, respectively.

The penetrating of the water molecules into the at least one of the first coating layer or the second coating layer may include performing aging by arranging the substrate layer, on which the hard coating layer is formed, in a constant temperature and humidity chamber.

The aging may be performed at 0 degrees Celsius or more and 40 degrees Celsius or less and at a relative humidity of 80% or more and 100% or less for 48 hours or more and 72 hours or less.

The first coating composition may include a trifunctional acrylic monomer and inorganic nanoparticles.

A weight percent of the trifunctional acrylic monomer may be in a range of 30% or more and 40% or less, based on a total weight percent of 100% of the first coating composition.

A weight percent of the inorganic nanoparticles may be in a range of 10% or more and 20% or less, based on a total weight percent of 100% of the first coating composition.

A weight percent of solid content of the first coating composition may be in a range of 50% or more and 60% or less, based on a total weight percent of 100% of the first coating composition.

The second coating composition may include a trifunctional acrylic monomer.

A weight percent of the trifunctional acrylic monomer may be in a range of 50% or more and 60% or less, based on a total weight percent of 100% of the second coating composition.

The substrate layer may include at least one of polycarbonate, polymethyl methacrylate, polyethylene terephthalate, polyimide, or poly-vinylidene fluoride.

The substrate layer may include a plurality of body layers stacked on each other.

At least one of the first coating composition or the second coating composition may be formed by one selected from slot-die coating, flow coating, dip coating, spray coating, inkjet printing, bar coating, or gravure coating.

Drying at least one of the first coating composition or the second coating composition at a temperature within a range of 50 degrees Celsius or more and 200 degrees Celsius or less may be further included.

The first coating composition may be precured in a light intensity within a range of 100 mJ/cm$^2$ or more and 700 mJ/cm$^2$ or less.

The first coating composition and the second coating composition may be cured in a light intensity within a range of 1,000 mJ/cm$^2$ or more and 3,000 mJ/cm$^2$ or less.

Other aspects, features, and advantages other than those described above will become apparent from the following drawings, claims, and detailed description of the present disclosure.

These general and specific aspects can be implemented using systems, methods, computer programs, or any combination of systems, methods, and computer programs.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3 is a cross-sectional view of part of the display apparatus shown in

FIG. 1;

DETAILED DESCRIPTION

Figure 1:
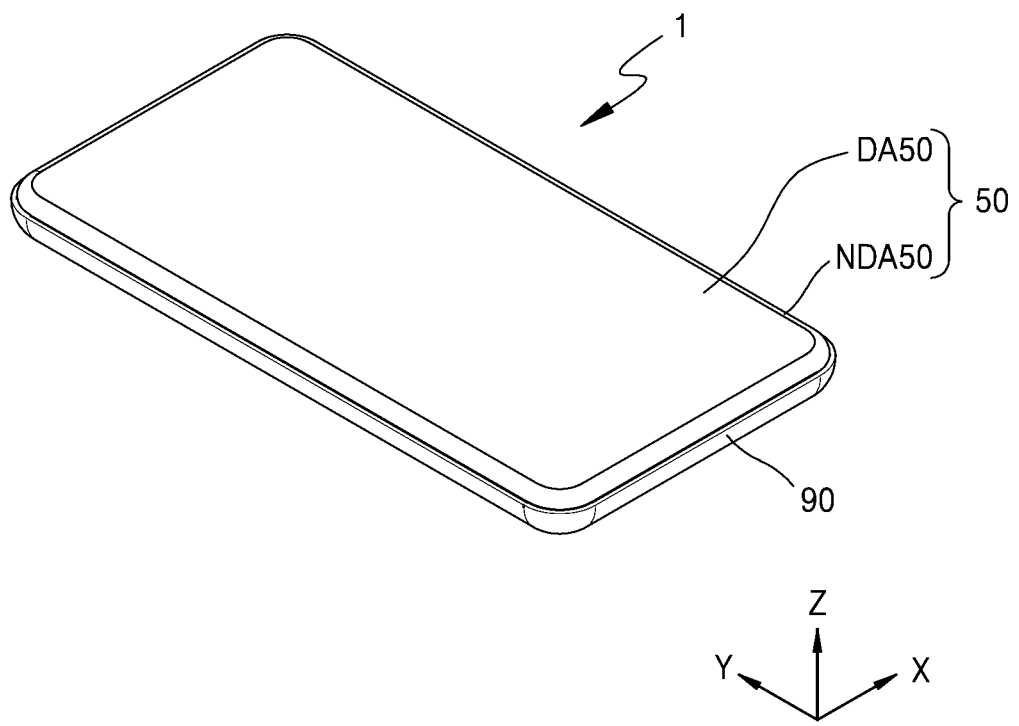
FIG. 1 is a perspective view of a display apparatus according to an embodiment.

Reference will now be made in more detail to embodiments, examples of which are illustrated in the accompanying drawings. Like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof. Also, the expression "any one selected from a, b and c", "any one . . . selected from a, b, and c", etc., indicates only a, only b, only c, both a and b, both a and c, both b and c, all of a, b, and c, or variations thereof.

Because the present disclosure may have diverse modified embodiments, embodiments are illustrated in the drawings and are described in the detailed description. An effect and a characteristic of the present disclosure, and a method of accomplishing them will be apparent when referring to embodiments described with reference to the drawings. However, the present disclosure is not limited to the embodiments described below, but may be implemented in various forms.

Hereinafter, embodiments of the present disclosure will be described in more detail with reference to the accompanying drawings, the same reference numerals are used to denote the same elements, and duplicate descriptions thereof may not be repeated.

It will be understood that although the terms "first," "second," etc. may be used herein to describe various elements, these elements should not be limited by these terms. These elements are only used to distinguish one element from another.

Further, the use of "may" when describing embodiments of the present disclosure refers to "one or more embodiments of the present disclosure".

An expression used in the singular encompasses the expression of the plural, unless it has a clearly different meaning in the context.

It will be further understood that the terms "includes," "including," "comprises," and/or "comprising" used herein specify the presence of stated features or constituent elements, but do not preclude the presence or addition of one or more other features or constituent elements.

It will be understood that when a layer, area, or constituent element is referred to as being "on," "connected to," or "coupled to" another layer, area, or element, it can be directly or indirectly "on," "connected to," or "coupled to" the other layer, area, or constituent element. That is, for example, intervening layers, areas, or constituent elements may be present.

Sizes of elements in the drawings may be exaggerated for convenience of explanation. For example, because sizes and thicknesses of components in the drawings are arbitrarily illustrated for convenience of explanation, the present disclosure is not limited thereto.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
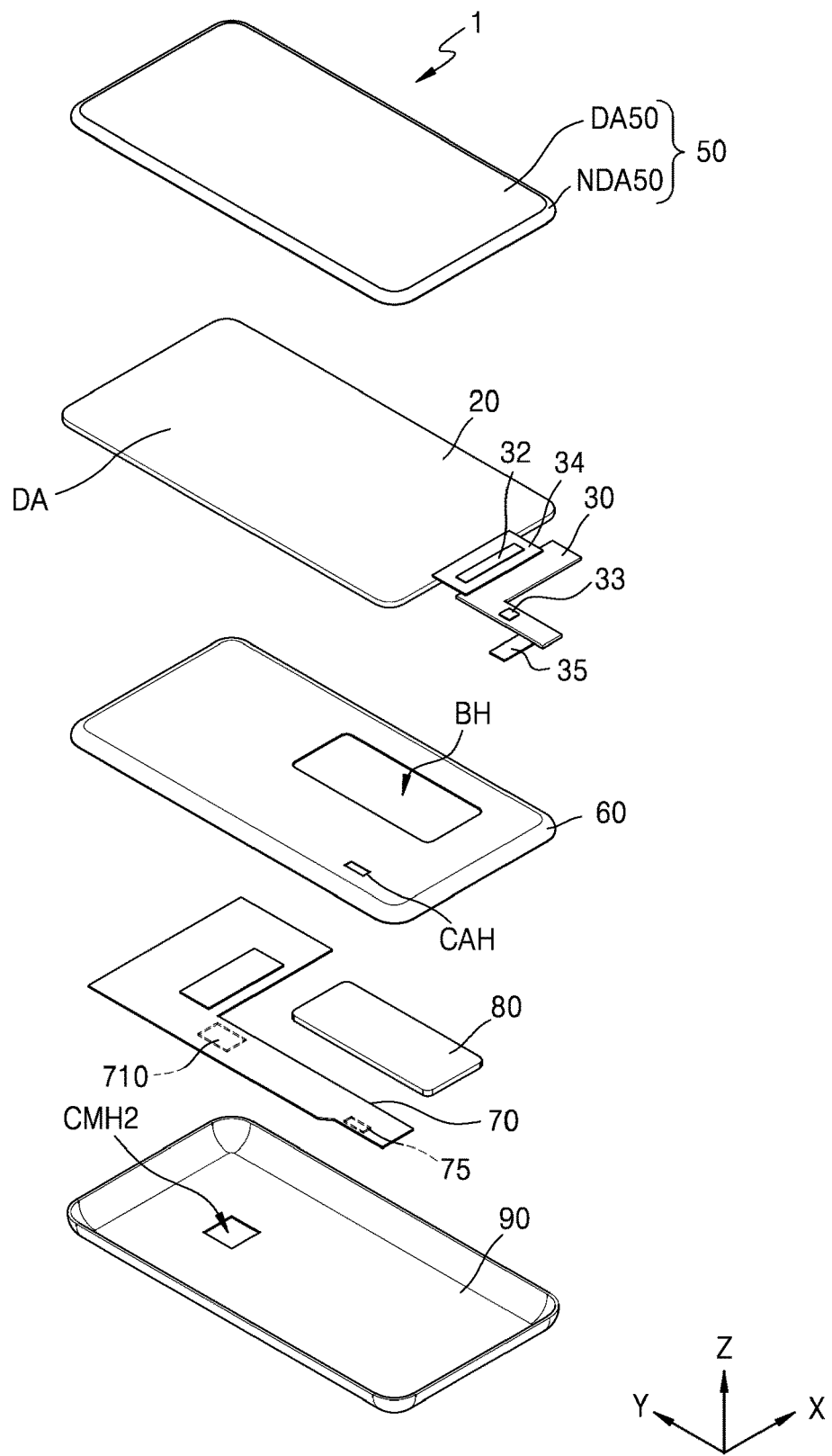
FIG. 2 is an exploded perspective view of the display apparatus shown in FIG. 1.

FIG. 1 is a perspective view of a display apparatus 1 according to an embodiment. FIG. 2 is an exploded perspective view of the display apparatus 1 shown in FIG. 1.

Referring to FIGS. 1 and 2, the display apparatus 1 according to an embodiment is a display apparatus configured to display a video and/or a still image, and may be used as a display screen of various suitable products such as televisions, laptops, monitors, billboards, or the like as well as mobile electronic devices such as mobile phones, smart phones, tablet personal computers (PC), mobile communication terminals, electronic notebooks, e-books, portable multimedia players (PMPs), navigators, or ultra-mobile PCs (UMPCs). Also, the display apparatus 1 according to an embodiment may be used in wearable devices such as smart watches, watch phones, glass-type displays, or head mounted displays (HMDs). In addition, the display apparatus 1 according to an embodiment may be used as a vehicle's dashboard, a center information display (CID) arranged at a vehicle's center fascia or dashboard, a room mirror display covering for a vehicle's side-view mirror, and/or a display, which is arranged at the back of a front seat, as entertainment for a passenger in a back seat of a vehicle.

For convenience of description, FIGS. 1 and 2 illustrate that the display apparatus 1 according to an embodiment is used as a smart phone. The display apparatus 1 according to an embodiment includes a window 50, a display panel 20, a display circuit board 30, a display driver 32, a touch sensor driver 33, a bracket 60, a main circuit board 70, a battery 80, and a lower cover 90.

In the present disclosure, the term "upper portion" denotes a direction in which the window 50 is arranged with respect to the display panel 20, that is, a +z direction, and the term "lower portion" denotes a direction in which the lower cover 90 is arranged with respect to the display panel 20, that is, a −z direction. Also, the terms "left", "right", "top", and "bottom" denote directions when the display panel 20 is seen on a plane. For example, the left direction denotes a −x direction, the right direction denotes a +x direction, the upper direction denotes a +y direction, and the lower direction denotes a −y direction.

The display apparatus 1 may have a rectangular shape on a plane. For example, as shown in FIG. 1, the display apparatus 1 may have a rectangular plane shape having short sides in a first direction (e.g., an x direction) and long sides in a second direction (e.g., a y direction). Corners, where the short sides in the first direction (e.g., the x direction) and the long sides in the second direction (e.g., the y direction) meet each other, may be rounded to have a certain curvature or may form a vertex (e.g., a vertex having a right-angle). The planar shape of the display apparatus 1 is not limited to the rectangular shape, but may be another polygonal, oval, or irregular shape.

The window 50 may be arranged on the display panel 20 to cover an upper surface of the display panel 20. Thus, the window 50 may function to protect the upper surface of the display panel 20.

The window 50 may include a transmissive cover portion DA50 corresponding to the display panel 20 and a light blocking cover portion NDA50 corresponding to an area other than the display panel 20. In some embodiments, the light blocking cover portion NDA50 may be around the transmissive cover portion DA50. The light blocking cover portion NDA50 may include a non-transparent material that blocks light. The light blocking cover portion NDA50 may include a pattern that may be shown to a user when an image is not displayed.

The display panel 20 may be located under the window 50. The display panel 20 may overlap the transmissive cover portion DA50 of the window 50.

The display panel 20 may be a light-emitting display panel including a light-emitting diode. For example, the display panel 20 may be an organic light-emitting display panel using an organic light-emitting diode including an organic emission layer, a micro light-emitting diode display panel using a micro light-emitting diode (micro LED), a quantum dot light-emitting display panel using a quantum dot light-emitting diode including a quantum dot emission layer, and/or an inorganic light-emitting display panel using an inorganic light-emitting diode including an inorganic semiconductor.

The display panel 20 may be a rigid display panel that has rigidity and is not easily bendable or a flexible display panel that has flexibility and is easily bendable, foldable, and/or rollable. For example, the display panel 20 may be a foldable display panel that may be folded and unfolded, a curved display panel with a curved display surface, a bent display panel with a bent area other than a display surface, a rollable display panel that may be rolled and unrolled, or a stretchable display panel that may be stretched.

The display panel 20 may be a transparent display panel that is implemented (e.g., implemented to be transparent)

such that an object or background arranged below the display panel 20 may be seen from above the display panel 20. In other words, an object may be seen through the transparent display panel. Alternatively, the display panel 20 may be a reflective display panel capable of reflecting an object or background above the display panel 20.

A first flexible film 34 may be attached to one edge of the display panel 20. One side of the first flexible film 34 may be attached to the one edge of the display panel 20 by using an anisotropic conductive film. The first flexible film 34 may be a flexible film that is bendable.

The display driver 32 may be arranged on the first flexible film 34. The display driver 32 may receive control signals and power voltages, and may generate and output signals and voltages for driving the display panel 20. The display driver 32 may include an integrated circuit (IC).

The display circuit board 30 may be attached to the other side of the first flexible film 34. The other side of the first flexible film 34 may be attached to an upper surface of the display circuit board 30 by using an anisotropic conductive film. The display circuit board 30 may be a flexible printed circuit board (FPCB) that is bendable, a rigid printed circuit board (RPCB) that is rigid and thus is not easily bendable, or a composite printed circuit board including both the FPCB and the RPCB.

The touch sensor driver 33 may be arranged on the display circuit board 30. The touch sensor driver 33 may include an IC. The touch sensor driver 33 may be attached onto the display circuit board 30. The touch sensor driver 33 may be connected (e.g., electrically connected) to touch electrodes of a touchscreen layer of the display panel 20 via the display circuit board 30.

The touchscreen layer of the display panel 20 may sense a user touch input by using at least one of various suitable touch methods such as a resistive overlay method and a capacitive overlay method. For example, when the touchscreen layer of the display panel 20 senses a user touch input by using the capacitive overlay method, the touch sensor driver 33 may determine whether there is a touch by a user by applying driving signals to driving electrodes from among the touch electrodes and sensing mutual capacitances (e.g., voltages charged in mutual capacitances) between the driving electrodes and sensing electrodes via the sensing electrodes from among the touch electrodes. The user touch may include a contact touch and a proximity touch. The contact touch denotes direct contact of an object such as a user finger or a pen with the window 50 arranged on the touchscreen layer. The proximity touch denotes that an object such as a user finger or a pen is positioned in close proximity to the window 50 (e.g., hovering). The touch sensor driver 33 may transmit sensor data to a main processor 710 according to the sensed voltages, and the main processor 710 analyzes the sensor data to calculate a touch coordinate at which a touch input is generated.

A power supplier for supplying driving voltages for driving pixels, scan driver, and display driver 32 of the display panel 20 may be additionally arranged on the display circuit board 30. Alternatively, the power supplier may be integrated with the display driver 32, and in this case, the display driver 32 and the power supplier may be provided as one IC.

The bracket 60 for supporting the display panel 20 may be arranged under the display panel 20. The bracket 60 may include plastic, metal, or both plastic and metal.

The main circuit board 70 and the battery 80 may be arranged under the bracket 60. The main circuit board 70 may be a printed circuit board or a flexible printed circuit board.

The main circuit board 70 may include the main processor 710 and a main connector 75. The main processor 710 may include an IC. Each of the main processor 710 and the main connector 75 may be arranged on or at any one surface of an upper surface and a lower surface of the main circuit board 70.

The main processor 710 may control all functions of the display apparatus 1. For example, the main processor 710 may output, to the display driver 32, digital video data via the display circuit board 30 so that the display panel 20 displays an image. Also, the main processor 710 receives an input of sensing data from the touch sensor driver 33. The main processor 710 determines whether there is a touch by a user according to the sensing data, and may execute an operation corresponding to the user's direct touch or proximity touch. For example, the main processor 710 may calculate the user's touch coordinate by analyzing the sensing data, and then execute or perform an application or operation indicated by an icon touched by the user. The main processor 710 may be an application processor including an IC, a central processing unit, or a system chip.

A cable 35 passing through a cable hole CAH of the bracket 60 may be connected to the main connector 75, and thus the main circuit board 70 may be connected (e.g., electrically connected) to the display circuit board 30.

The battery 80 may receive power from an external wireless power transmission apparatus by using at least one of an inductive coupling method based on a magnetic induction phenomenon and a magnetic resonance coupling method based on an electromagnetic resonance phenomenon. The battery 80 may be arranged not to overlap the main circuit board 70 in a third direction (e.g., a z direction or a thickness direction of the display apparatus 1). The battery 80 may overlap a battery hole BH of the bracket 60.

The lower cover 90 may be arranged under the main circuit board 70 and the battery 80. The lower cover 90 may be coupled and fixed to the bracket 60. The lower cover 90 may form an external appearance of a lower surface of the display apparatus 1. The lower cover 90 may include plastic, metal, or both plastic and metal.

A second camera hole CMH2 may be formed in the lower cover 90.

The display apparatus 1 is not limited to the above, and may include various suitable components. The components may include various suitable sensors such as ultrasonic sensors, illumination sensors, and the like. The display apparatus 1 may include a camera apparatus. The camera device may photograph the front side of the display apparatus 1 or may photograph a background positioned on the rear side of the display apparatus 1.

Figure 3:
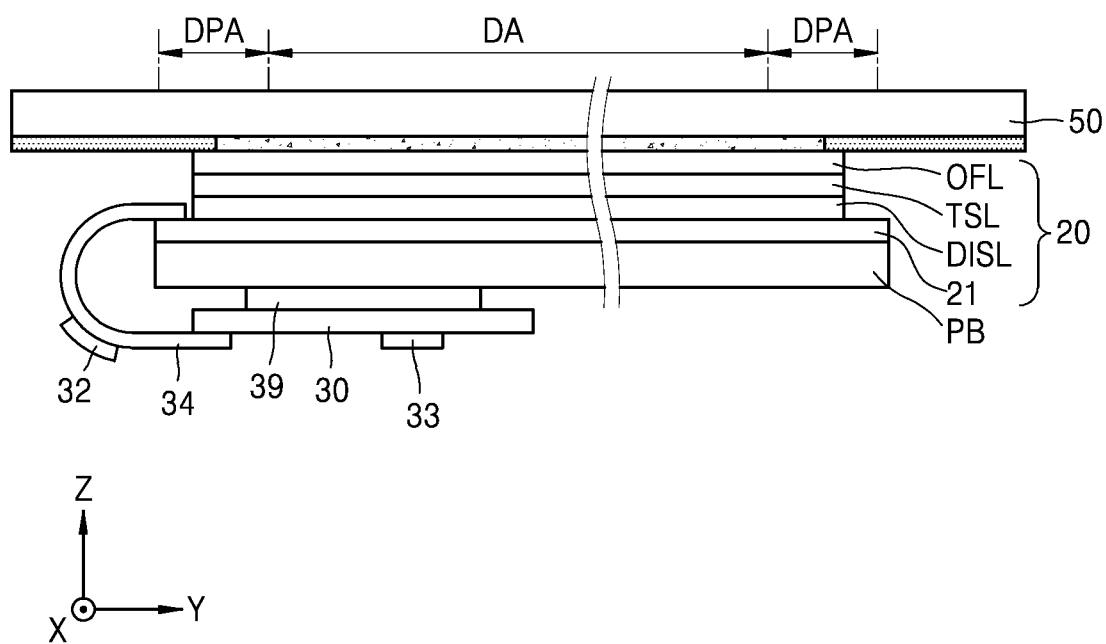

FIG. 3 is a cross-sectional view of the display apparatus 1 shown in FIG. 1.

Referring to FIG. 3, the display apparatus 1 may include a substrate 21, a display layer DISL, a touchscreen layer TSL, an optical functional layer OFL, and a panel protection member PB. The display panel 20 may include a substrate 21, a display layer DISL, a touchscreen layer TSL, and an optical functional layer OFL.

The substrate 21 may include an insulating material such as glass, quartz, and/or polymer resin. The substrate 21 may be a rigid substrate or a flexible substrate that is bendable, foldable, rollable, and/or the like. For example, the substrate 21 may include polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 21 may have a multi-layered structure including a layer including the above-described polymer resin and an organic layer. For example, the substrate 21 may include two layers including the above-described polymer resin and an inorganic barrier layer arranged between the two layers.

The display layer DISL may be arranged on the substrate 21. The display layer DISL may include pixels and may display an image. The display layer DISL may include a circuit layer including thin-film transistors, a display element layer including display elements, and an encapsulation member for encapsulating the display element layer.

The display layer DISL may include a display area DA and a peripheral area DPA. The display area DA may be an area in which the pixels are arranged to display an image. The peripheral area DPA may be arranged outside the display area DA and may not display an image. The peripheral area DPA may be around (e.g., surround) the display area DA. The peripheral area DPA may be an area ranging from the outside of the display area DA to the edge of the display panel 20. The display area DA may include pixel circuits for driving pixels, scan lines, data lines, power lines, and/or the like connected to the pixel circuits, as well as the pixels. The peripheral area DPA may include a scan driver for applying scan signals to the scan lines, fan-out lines connecting the data lines to the display driver 32, and/or the like.

The touchscreen layer TSL may be arranged on the display layer DISL. The touchscreen layer TSL may include touch electrodes and may be a layer for sensing whether there is a touch by a user. The touchscreen layer TSL may be directly formed on the encapsulation member of the display layer DISL. Also, the touchscreen layer TSL may be separately formed and then coupled onto the encapsulation member of the display layer DISL via an adhesive layer such as an optically clear adhesive (OCA).

The optical functional layer OFL may be arranged on the touchscreen layer TSL. The optical functional layer OFL may include an anti-reflective layer. The anti-reflective layer may reduce a reflectivity of light (e.g., external light) incident to the display apparatus 1 from outside.

In some embodiments, the anti-reflective layer may include a polarization film. The polarization film may include a linear polarization plate and a phase retardation film such as a quarter-wave ($\lambda/4$) plate. The phase retardation film may be arranged on the touchscreen layer TSL, and the linear polarization plate may be arranged on the phase retardation plate.

In some embodiments, the anti-reflective layer may include a filter layer including a black matrix and color filters. The color filters may be arranged considering color of light emitted from each of the pixels in the display apparatus 1. For example, the filter layer may include a red color filter, a green color filter, or a blue color filter.

In some embodiments, the anti-reflective layer may include a destructive interference structure. The destructive interference structure may include a first reflective layer and second reflective layer arranged on or at different layers from each other. First reflected light and second reflected light that are respectively reflected by the first reflective layer and the second reflective layer may destructively interfere with each other, and accordingly a reflectivity of external light may be reduced.

The window 50 may be arranged on the optical functional layer OFL. The window 50 may be attached onto the optical functional layer OFL by a transparent adhesive member such as an optically clear adhesive (OCA) film.

The panel protection member PB may be arranged under the display panel 20. The panel protection member PB may be attached to the lower surface of the display panel 20 via an adhesive member. The adhesive member may be a pressure sensitive adhesive (PSA). The panel protection member PB may include at least one of a light-absorbing layer for absorbing light incident from outside, a cushion layer for absorbing impact from outside, and a heat dissipation layer for effectively discharging heat of the display panel 20.

The light-absorbing layer may be arranged under the display panel 20. The light-absorbing layer may prevent or reduce the light transmission such that elements under the light-absorbing layer, for example, the display circuit board 30 and the like, may be prevented or substantially prevented from being visible from above the display panel 20. The light-absorbing layer may include a light-absorbing material such as black pigment and/or black dye.

The cushion layer may be arranged under the light-absorbing layer. The cushion layer absorbs external impact to prevent or substantially prevent the display panel 20 from being damaged. The cushion layer may include a single layer or a plurality of layers. For example, the cushion layer may include polymer resin such as polyurethane, polycarbonate, polypropylene, and/or polyethylene, and/or may include a material having elasticity such as a rubber, a urethane-based material, and/or a sponge formed by foam molding an acrylic material.

The heat dissipation layer may be arranged under the cushion layer. The heat dissipation layer may include a first heat dissipation layer and a second heat dissipation layer. The first heat dissipation layer may include graphite, carbon nanotubes, and/or the like, and the second heat dissipation layer include a metal thin film such as copper, nickel, ferrite, and/or silver that are capable of shielding electromagnetic waves and may have excellent thermal conductivity.

The first flexible film 34 may be arranged in the peripheral area DPA at one edge of the display panel 20. The first flexible film 34 may be bent to a lower portion of the display panel 20, and the display circuit board 30 may be arranged on a lower surface of the panel protection member PB. The display circuit board 30 may be attached and fixed onto the lower surface of the panel protection member PB via a first adhesive member 39. The first adhesive member 39 may be a PSA.

Figure 4:
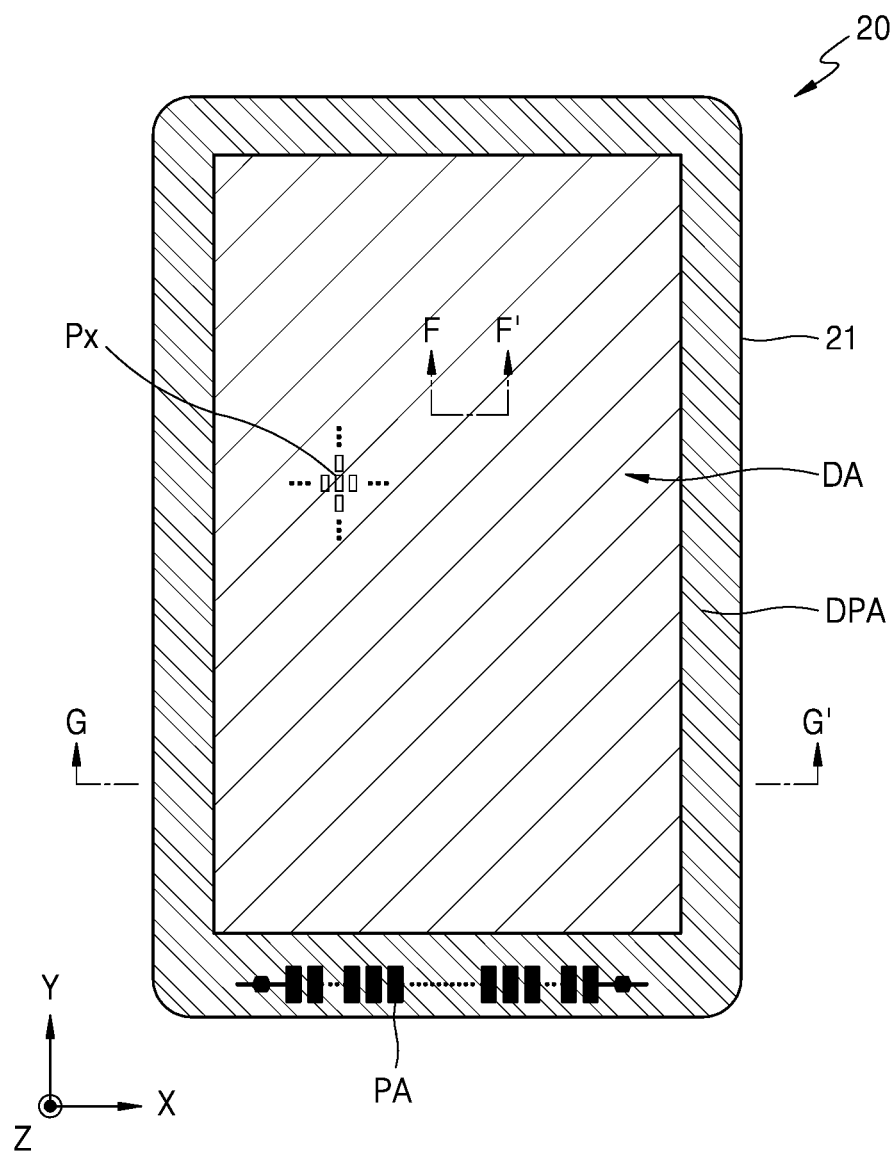
FIG. 4 is a plan view of a display panel shown in FIG. 2.
Figure 5:
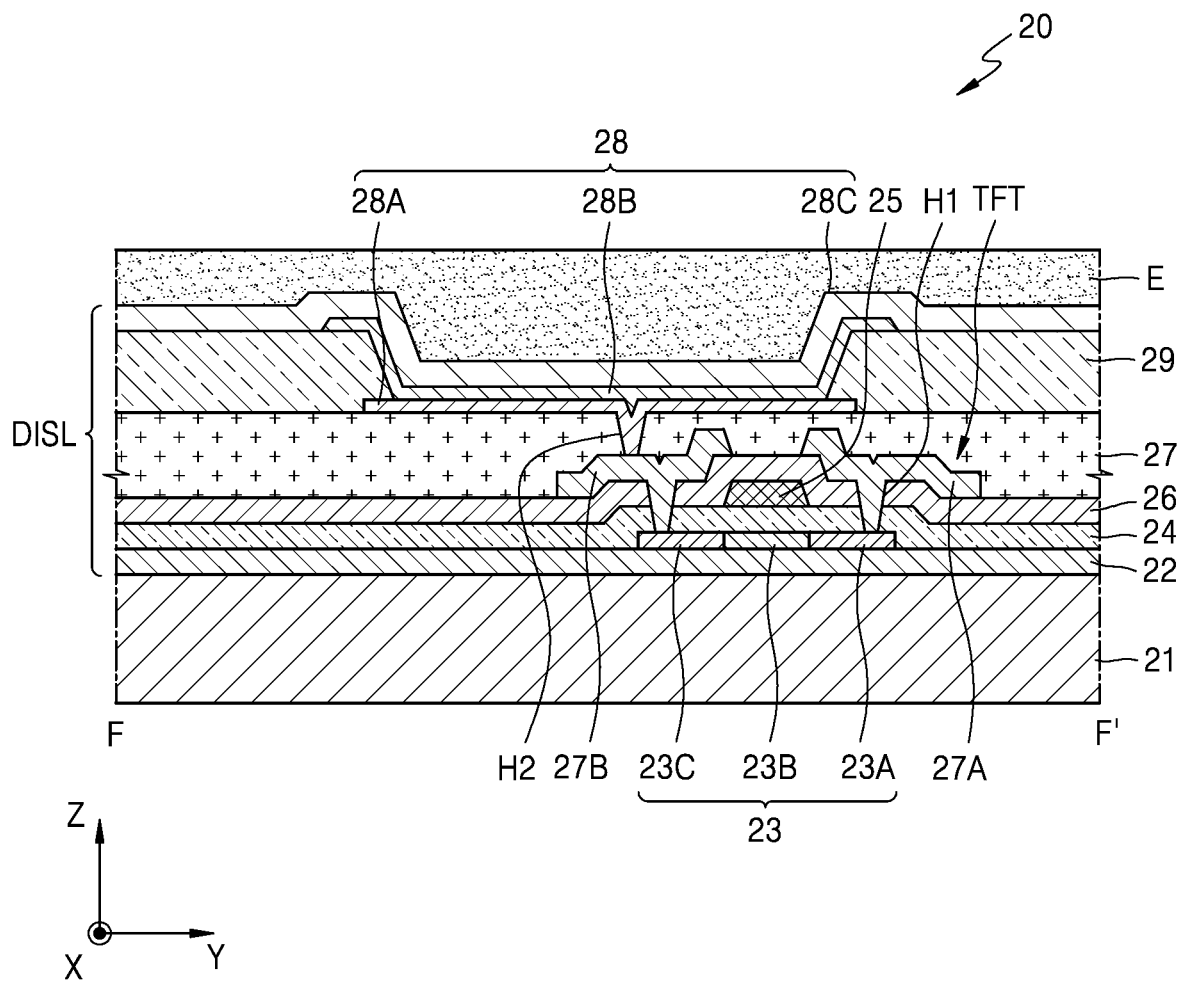
FIG. 5 is a cross-sectional view of the display panel taken along the line F-F' of FIG. 4.

FIG. 4 is a plan view of a display panel according to an embodiment. FIG. 5 is a cross-sectional view of the display panel 20 taken along the line F-F' of FIG. 4.

Referring to FIGS. 4 and 5, the display panel 20 may include the display area DA and the peripheral area DPA around the display area DA. The display area DA and the peripheral area DPA may be defined on the substrate 21. A pixel Px may be arranged in the display area DA, and a power line or the like may be arranged in the peripheral area DPA. Also, a pad unit PA may be arranged in the peripheral area DPA.

The display panel 20 may include the display layer DISL. In this case, the encapsulation member of the display layer DISL may include a sealing unit arranged on the substrate 21 and an encapsulation substrate connected to the sealing unit and arranged to face the substrate 21. In another embodiment, the encapsulation member of the display layer DISL may include a thin-film encapsulation layer E that shields at least a part of the display layer DISL.

The display layer DISL may include a thin-film transistor TFT and organic light-emitting diode (OLED) 28 arranged over the substrate 21. In this case, the substrate 21 may be the same as or similar to the above description.

The thin-film transistor TFT may be formed over the substrate 21, a passivation layer 27 may be formed to cover the thin-film transistor TFT, and the OLED 28 may be formed over the passivation layer 27.

A buffer layer 22 including an organic compound and/or an inorganic compound may be further arranged on an upper surface of the substrate 21. For example, the buffer layer 22 may include $SiO_x$ (x≥1) and/or $SiN_x$ (x≥1).

An active layer 23 arranged in a certain pattern is formed on the buffer layer 22, and then the active layer 23 is buried or covered by a gate insulating layer 24. The active layer 23 includes a source area 23A and a drain area 23C, and further includes a channel area 23B between the source area 23A and the drain area 23C. The source area 23A and the drain area 23C may be at opposite sides of the channel area 23B.

The active layer 23 may be formed to include various suitable materials. For example, the active layer 23 may include an inorganic semiconductor material such as amorphous silicon or crystalline silicon. As another example, the active layer 23 may include an oxide semiconductor. As another example, the active layer 23 may include an organic semiconductor material.

In the active layer 23, the source area 23A and the drain area 23C are doped with impurities according to the type of a thin-film transistor (TFT) such as a driving TFT or a switching TFT.

A gate electrode 25 corresponding to the active layer 23 and an insulating interlayer 26 burying or covering the gate electrode 25 are formed on an upper surface of the gate insulating layer 24.

Also, a contact hole H1 is formed in the insulating interlayer 26 and the gate insulating layer 24, and then a source electrode 27A and a drain electrode 27B are formed on the insulating interlayer 26 to respectively contact the source area 23A and the drain area 23C.

A passivation layer 27 is formed on the thin-film transistor TFT formed as such, and a pixel electrode 28A of the OLED 28 is formed on the passivation layer 27. The pixel electrode 28A contacts the drain electrode 27B of the thin-film transistor TFT via or through a via hole H2 formed in the passivation layer 27. The passivation layer 27 may have a single-layer or multi-layer (e.g., two or more layer) structure including an inorganic material and/or an organic material. The passivation layer 27 may be formed as a planarization layer to have an upper surface that is flat regardless of the profile or curvature of a layer (e.g., a lower layer) thereunder or may be formed to have a profile or curvature along or corresponding to the curvature of a layer thereunder.

After the pixel electrode 28A is arranged on the passivation layer 27, a pixel-defining layer 29 including an organic material and/or an inorganic material is formed to cover the pixel electrode 28A and the passivation layer 27, and the pixel electrode 28A is exposed via an opening area of the pixel-defining layer 29.

The pixel electrode 28A may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). The pixel electrode 28A may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, the pixel electrode 28A may have a structure including layers including ITO, IZO, ZnO, or $In_2O_3$ provided on/under the above-described reflective layer. As a non-limiting example, the pixel electrode 28A may have a stacked structure of ITO/Ag/ITO.

Also, an intermediate layer 28B and an opposite electrode 28C is formed over the pixel electrode 28A. The opposite electrode 28C may be formed on a surface (e.g., an entire surface) of the display area DA. In this case, the opposite electrode 28C may be formed over the intermediate layer 28B and the pixel-defining layer 29. Hereinafter, for convenience of description, a detailed description of a case where the opposite electrode 28C is formed over the intermediate layer 28B and the pixel-defining layer 29 may be given.

The pixel electrode 28A functions as an anode electrode and the opposite electrode 28C functions as a cathode electrode, or the polarities of the pixel electrode 28A and the opposite electrode 28C may be reversed.

The pixel electrode 28A and the opposite electrode 28C may be insulated from each other by the intermediate layer 28B, and light may be emitted from an organic emission layer by applying voltages of different polarities to the intermediate layer 28B.

The intermediate layer 28B may include an organic emission layer. As another example, the intermediate layer 28B may include an organic emission layer, and may further include at least one of a first auxiliary layer or a second auxiliary layer. The first auxiliary layer may include at least one of a hole injection layer or a hole transport layer, and the second auxiliary layer may include at least one of an electron transport layer or an electron injection layer. However, the present disclosure is not limited thereto, and the intermediate layer 28B may include the organic emission layer and may further include other various suitable functional layers.

There may be a plurality of intermediate layers 28B, and the plurality of intermediate layers 28B may form the display area DA. In this case, the plurality of intermediate layers 28B may be spaced from each other in the display area DA.

The opposite electrode 28C may include a conductive material having a low work function. For example, the opposite electrode 28C may include a (semi-) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 28C may further include, on the (semi-)transparent layer including the above-described material, a layer such as ITO, IZO, ZnO, or $In_2O_3$. The opposite electrode 28C may be formed (e.g., integrally formed) to correspond to OLEDs included in the display area DA.

An upper layer including an organic material may be formed on the opposite electrode 28C. The upper layer may be a layer provided to protect the opposite electrode 28C and concurrently (e.g., simultaneously) to increase light extraction efficiency. The upper layer may include an organic material having a higher refractive index than that of the opposite electrode 28C. Alternatively, the upper layer may include a stack of layers having different refractive indices from each other. For example, the upper layer may include a stack of a high refractive index layer/a low refractive index layer/a high refractive index layer. In this case, a refractive index of the high refractive index layer may be 1.7 or more, and a refractive index of the low refractive index layer may be 1.3 or less.

The upper layer may further include LiF. Alternatively, the upper layer may further include an inorganic insulating material such as a silicon oxide ($SiO_2$) or a silicon nitride ($SiN_x$). The upper layer may be omitted as desired. However, hereinafter, for convenience of description, a case in which the upper surface is arranged on the opposite electrode 28C may be mainly described in more detail.

The thin-film encapsulation layer E that shields the upper layer covers a part of the display area DA and the peripheral area DPA to prevent or reduce infiltration of external moisture and oxygen. The thin-film encapsulation layer E may include at least one organic encapsulation layer and at least one inorganic encapsulation layer. Hereinafter, for convenience of description, a case in which the thin-film encapsulation layer E includes a first inorganic encapsulation layer, an organic encapsulation layer, and a second inorganic encapsulation layer, which are stacked (e.g., sequentially stacked) on an upper surface of the upper layer, may be mainly described in more detail.

In this above case, the first inorganic encapsulation layer covers the opposite electrode 28C, and may include a silicon oxide, a silicon nitride, and/or a silicon oxynitride. The first inorganic encapsulation layer is formed along a structure thereunder, and thus an upper surface of the first inorganic encapsulation layer may not be flat. The organic encapsulation layer covers the first inorganic encapsulation layer, and unlike the first inorganic encapsulation layer, an upper surface of the organic encapsulation layer may be approximately flat. In more detail, the upper surface of the organic encapsulation layer may be approximately flat in a portion corresponding to the display area DA. The organic encapsulation layer may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer covers the organic encapsulation layer, and may include a silicon oxide, a silicon nitride, and/or a silicon oxynitride.

A touchscreen layer may be arranged on the thin-film encapsulation layer E.

Figure 6:
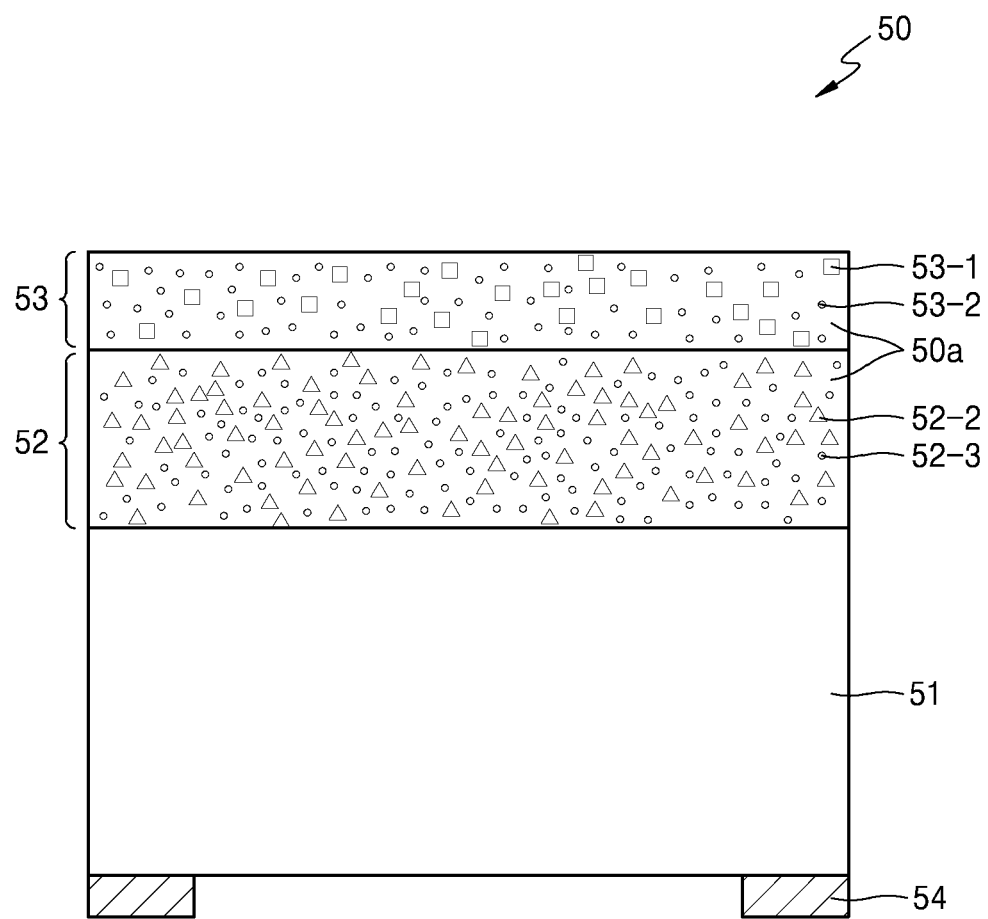
FIG. 6 is a cross-sectional view of a window shown in FIG. 2.

FIG. 6 is a cross-sectional view of the window 50 shown in FIG. 2.

Referring to FIG. 6, the window 50 may include a substrate layer 51, a first coating layer 52, a second coating layer 53, and a non-transparent layer 54.

The substrate layer 51 may include a transparent material. For example, the substrate layer 51 may include at least one of polycarbonate, polymethyl methacrylate, polyethylene terephthalate, polyimide, or poly-vinylidene fluoride.

The first coating layer 52 may be arranged on the substrate layer 51. In this case, the first coating layer 52 may include an acrylic polymer 50a, an inorganic nanoparticle 52-2, and a first water molecule 52-3. For example, the acrylic polymer 50a may be formed by mixing a trifunctional acrylic monomer with an additive such as a solvent and performing a polymerization reaction on the mixture.

The first coating layer 52 may be prepared by curing a first coating composition. In this case, the first coating composition may include a trifunctional acrylic monomer, the inorganic nanoparticle 52-2, and a solvent. In more detail, the trifunctional acrylic monomer may include at least one of trimethylolpropane triacrylate, ethoxylated (3 mol) trimethylol propane triacrylate, ethoxylated (6 mol) trimethylol propane triacrylate, propoxylated (3 mol) trimethylol propane triacrylate (TMPTA), or pentaerythritol triacrylate (PETA). Also, the inorganic nanoparticle 52-2 may be nano silica.

A weight percent of the trifunctional acrylic monomer may be in a range of 30% or more and 40% or less, based on a total weight percent of 100% of the first coating composition. In this case, when a weight percent of the trifunctional acrylic monomer is less than 30% based on a total weight percent of 100% of the first coating composition, a hardness of the first coating layer 52 may be low or a bond between trifunctional acrylic monomers may not be smoothly formed when the first coating layer 52 is prepared. On the contrary, when a weight percent of the trifunctional acrylic monomer is greater than 40% based on a total weight percent of 100% of the first coating composition, fluidity of the first coating composition decreases, and thus when the first coating composition is arranged on the substrate layer 51, the first coating composition may not be arranged in or be present in a certain area.

A weight percent of the inorganic nanoparticle 52-2 may be in a range of 10% or more and 20% or less, based on a total weight percent of 100% of the first coating composition.

The first coating composition may further include a photoinitiator, in addition to the above materials.

When the first coating layer 52 is prepared by curing the first coating composition as described above, the solvent of the first coating composition may be evaporated and removed. In this case, a solid content of the first coating composition may be in a range of 50% or more and 60% or less, based on a total weight percent of 100% of the first coating composition.

A weight percent of the acrylic polymer 50a in the first coating layer 52 prepared as described above may be in a range of 50% or more and 80% or less, based on a total weight percent of 100% of the first coating layer 52.

The second coating layer 53 may include the acrylic polymer 50a, a fluorine-based compound 53-1, and a second water molecule 53-2.

The second coating layer 53 may be prepared by curing a second coating composition. In this case, the second coating composition may include a trifunctional acrylic monomer, the fluorine-based compound 53-1, and a solvent. In this case, the trifunctional acrylic monomer may be the same material as described in connection with the first coating composition. For example, the trifunctional acrylic monomer included in the second coating composition may be the same as the trifunctional acrylic monomer included in the first coating composition. A weight percent of the trifunctional acrylic monomer included in the second coating composition may be in a range of 50% or more and 60% or less, based on a total weight percent of 100% of the second coating composition. In this case, when a weight percent of the trifunctional acrylic monomer is less than 50% based on a total weight percent of 100% of the second coating composition, a bond with the first coating layer may not be robust. Also, when a weight percent of the trifunctional acrylic monomer is greater than 60% based on a total weight percent of 100% of the second coating composition, fluidity of the second coating composition decreases, and thus the second coating composition may not be uniformly coated on the first coating layer 52. The fluorine-based compound 53-1 may be a leveling agent. A surface flatness and slip properties of the second coating layer 53 may be increased using the fluorine-based compound 53-1.

When the second coating layer 53 is prepared by curing the second coating composition as described above, the solvent of the second coating composition may be evaporated and removed. In this case, a weight percent of solid content of the second coating composition may be in a range of 50% or more and 60% or less, based on a total weight percent of 100% of the second coating composition. In this above case, a weight percent of the acrylic polymer 50a in the second coating layer 53 may be in a range of 80% or more and less than 100%, based on a total weight percent of 100% of the second coating layer 53.

The second coating composition may further include a photoinitiator, in addition to the above materials. In this case, the photoinitiator of the first coating composition and the photoinitiator of the second coating composition may be the same material.

In connection with the above, the first coating composition and the second coating composition may include various suitable materials, in addition to the above materials. For example, at least one of the first coating composition or the second coating composition may include at least one of an ultraviolet (UV) stabilizer that blocks or absorbs UV rays, a heat stabilizer, and an antistatic agent.

When the first coating layer 52 and the second coating layer 53 are formed as described above, a thickness of the first coating layer 52 may be greater than a thickness of the second coating layer 53. The thickness may be measured as a distance from an upper surface to a lower surface of a layer based on FIG. 6. For example, a thickness of the first coating layer 52 may be in a range of 30 µm or more and 40 µm or less. Also, a thickness of the second coating layer 53 may be in a range of 1 µm or more and 10 µm or less.

The non-transparent layer 54 may be arranged in the substrate layer 51 or may be arranged on one surface of the substrate layer 51. In particular, the non-transparent layer 54 may be arranged at an edge area of the substrate layer 51. The non-transparent layer 54 may block light or may include a light blocking layer. In this case, the light blocking layer may include a black ink, a black film, or the like.

Meanwhile, hereinafter, a method of manufacturing a window will be described in more detail.

FIGS. 7A-7G are cross-sectional views of a method of manufacturing the window 50 shown in FIG. 6.

Figure 7A:
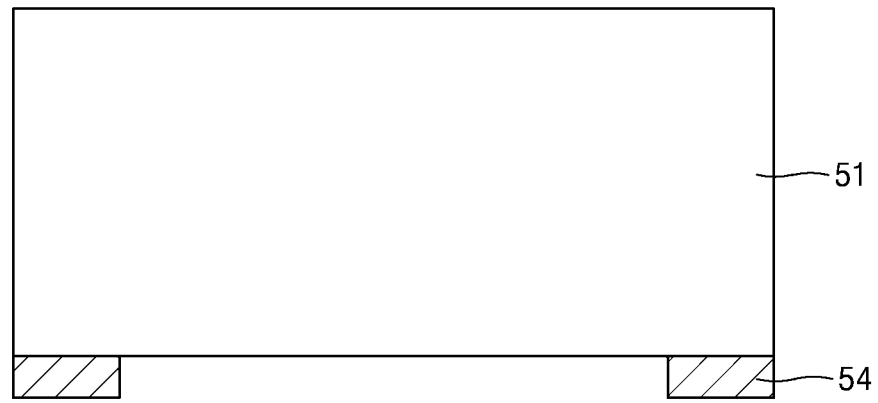
FIGS. 7A-7G are cross-sectional views of a method of manufacturing the window shown in FIG. 6.
Figure 7A:
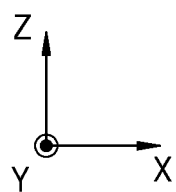

Referring to FIG. 7A, the substrate layer 51 and the non-transparent layer 54 may be manufactured and prepared. In this case, the substrate layer 51 may be manufactured via injection or the like, and after the substrate layer 51 is manufactured, the non-transparent layer 54 may be printed on the substrate layer 51 or may be attached to the substrate layer 51.

Figure 7B:
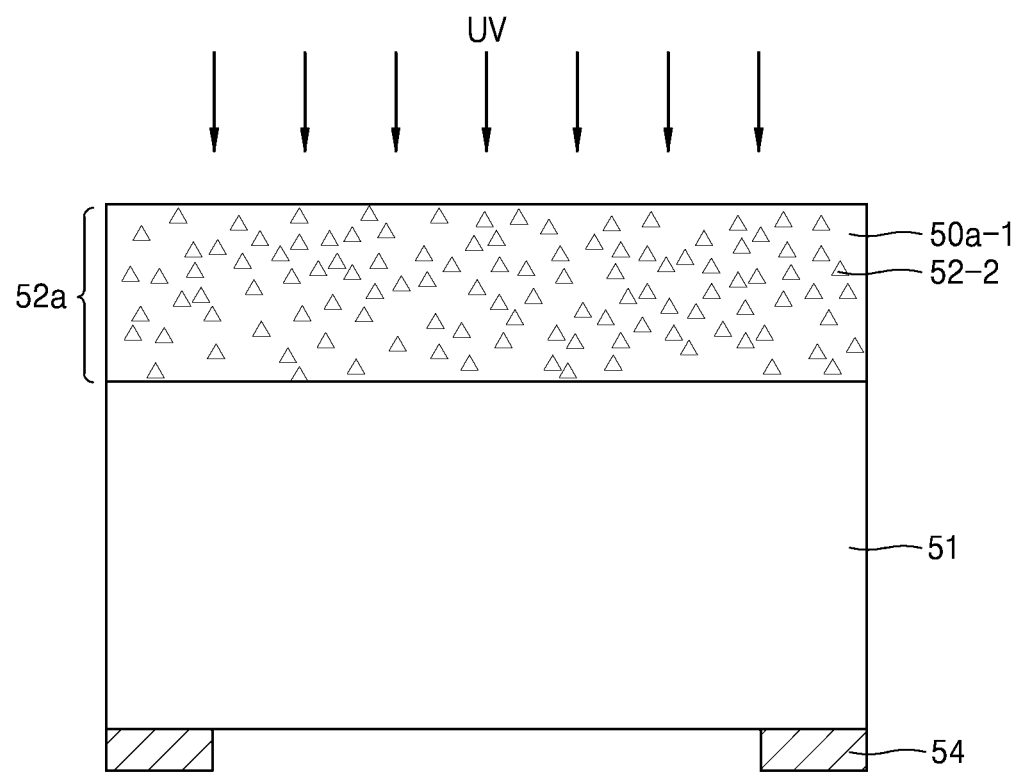

Referring to FIG. 7B, a first coating composition 52a may be coated on the substrate layer 51. In this case, the first coating composition 52a may be a mixture of a trifunctional acrylic monomer 50a-1, the inorganic nanoparticle 52-2, an additive such as a photoinitiator, and a solvent, and may be coated on the substrate layer 51 by any one method selected from slot-die coating, flow coating, dip coating, spray coating, inkjet printing, bar coating, and gravure coating.

Afterwards, the first coating composition 52a may be dried utilizing an air-floating method in which gas is sprayed onto the first coating composition 52a in an environment at a temperature in a range of 50° C. or more and 200° C. or less. Also, the first coating composition 52a may be UV-cured utilizing mercury lamp or metal halide that emit UV rays. In this case, the first coating composition 52a may be in a precured state. In this case, the first coating composition 52a may be irradiated with UV rays in a light intensity within a range of 100 mJ/cm$^2$ or more and 700 mJ/cm$^2$ or less. When a light intensity of irradiated UV rays is less than 100 mJ/cm$^2$, the first coating composition 52a is not sufficiently cured and thus may not be able to maintain the shape, and when a light intensity of irradiated UV rays is greater than 700 mJ/cm$^2$, the first coating composition 52a is too cured such that a bond with a second coating composition 53a may be inhibited. By irradiating an suitable or appropriate light intensity of UV rays, the first coating composition 52a may be in a gel form without being completely cured. In this case, when the first coating composition 52a is precured, part of the trifunctional acrylic monomer 50a-1 may become an acrylic polymer, and another part may not become an acrylic polymer.

Figure 7C:
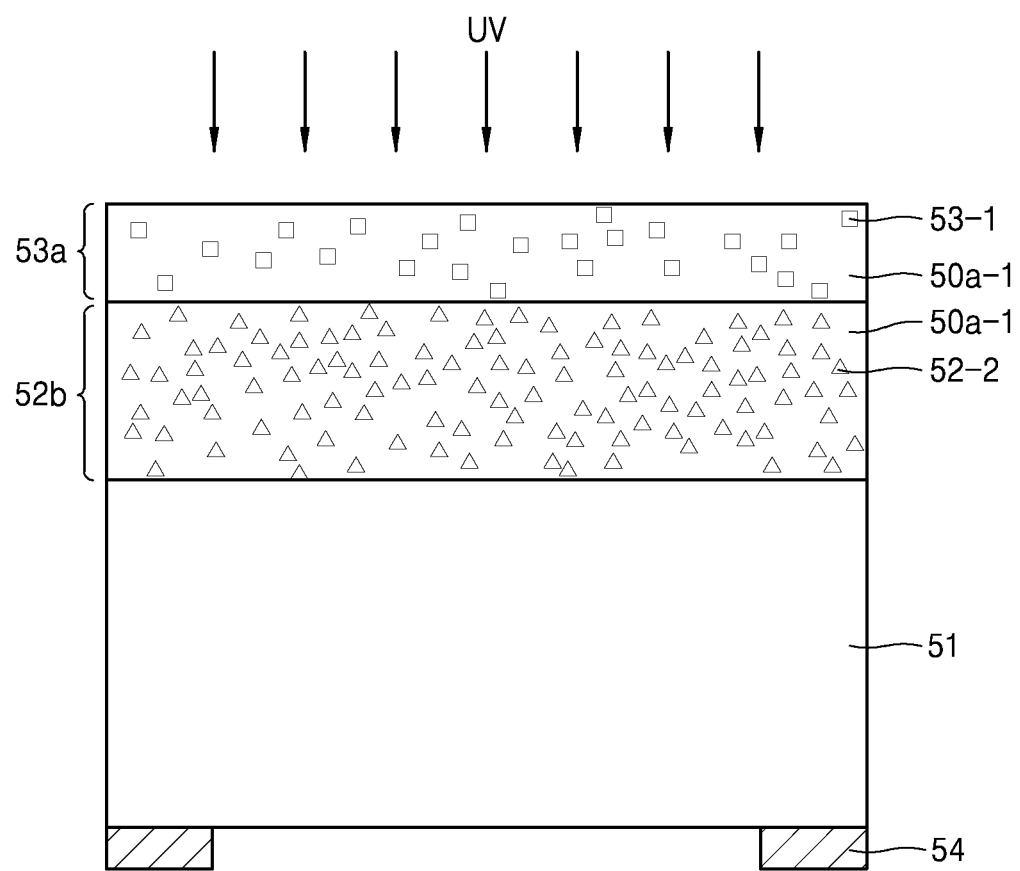

Referring to FIG. 7C, the second coating composition 53a may be coated on the precured first coating composition 52a. In this case, the second coating composition 53a may be a mixture of the trifunctional acrylic monomer 50a-1, the fluorine-based compound 53-1, a photoinitiator, and a solvent, and may be coated on the precured first coating composition 52a by any one method selected from slot-die coating, flow coating, dip coating, spray coating, inkjet printing, bar coating, and gravure coating.

Afterwards, the second coating composition 53a may be dried in an air-floating method in which gas is sprayed onto the second coating composition 53a in an environment at a temperature in a range of 50° C. or more and 200° C. or less. Also, the second coating composition 53a may be UV-cured utilizing mercury lamp or metal halide that emit UV rays. In this case, the precured first coating composition 52a and the second coating composition 53a may be completely cured. In this case, a light intensity within a range of 1,000 mJ/cm$^2$ or more and 3,000 mJ/cm$^2$ or less may be irradiated to the second coating composition 53a. When a light intensity is less than 1,000 mJ/cm$^2$, UV rays do not penetrate into the precured first coating composition 52a, and thus the precured first coating composition 52a may not be completely cured. On the contrary, when a light intensity is greater than 3000 mJ/cm$^2$, excessive energy is applied, and thus the second coating composition 53a may be deformed or a bond with the precured first coating composition 52a may not be appropriately or suitably formed.

The precured first coating composition 52a and the second coating composition 53a may be completely cured to respectively form a first coating layer and a second coating layer. In this case, an unreacted acrylic monomer present in the precured first coating composition 52a and the trifunctional acrylic monomer 50a-1 present in the second coating composition 53a may become an acrylic polymer.

Figure 7D:
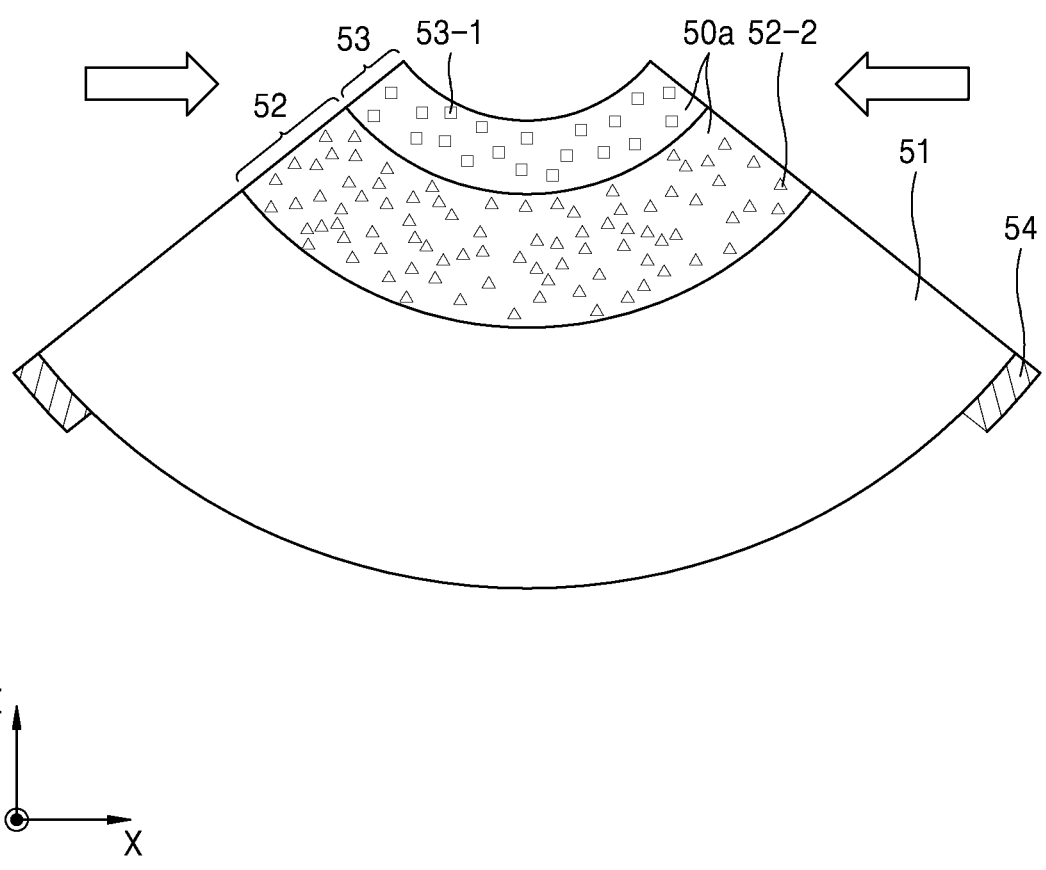

However, warpage may occur as at least one of the first coating layer or the second coating layer shrinks in a process of forming the first coating layer and the second coating layer via the curing reaction as described above. For example, as shown in FIG. 7D, as at least one of the first coating layer 52 or the second coating layer 53 shrinks, an upper surface of the second coating layer 53 may be bent in a concave shape. In particular, in this case, because an upper surface of the window 50 is not flat, displaying a clear image on the display apparatus 1 may be difficult.

Figure 7E:
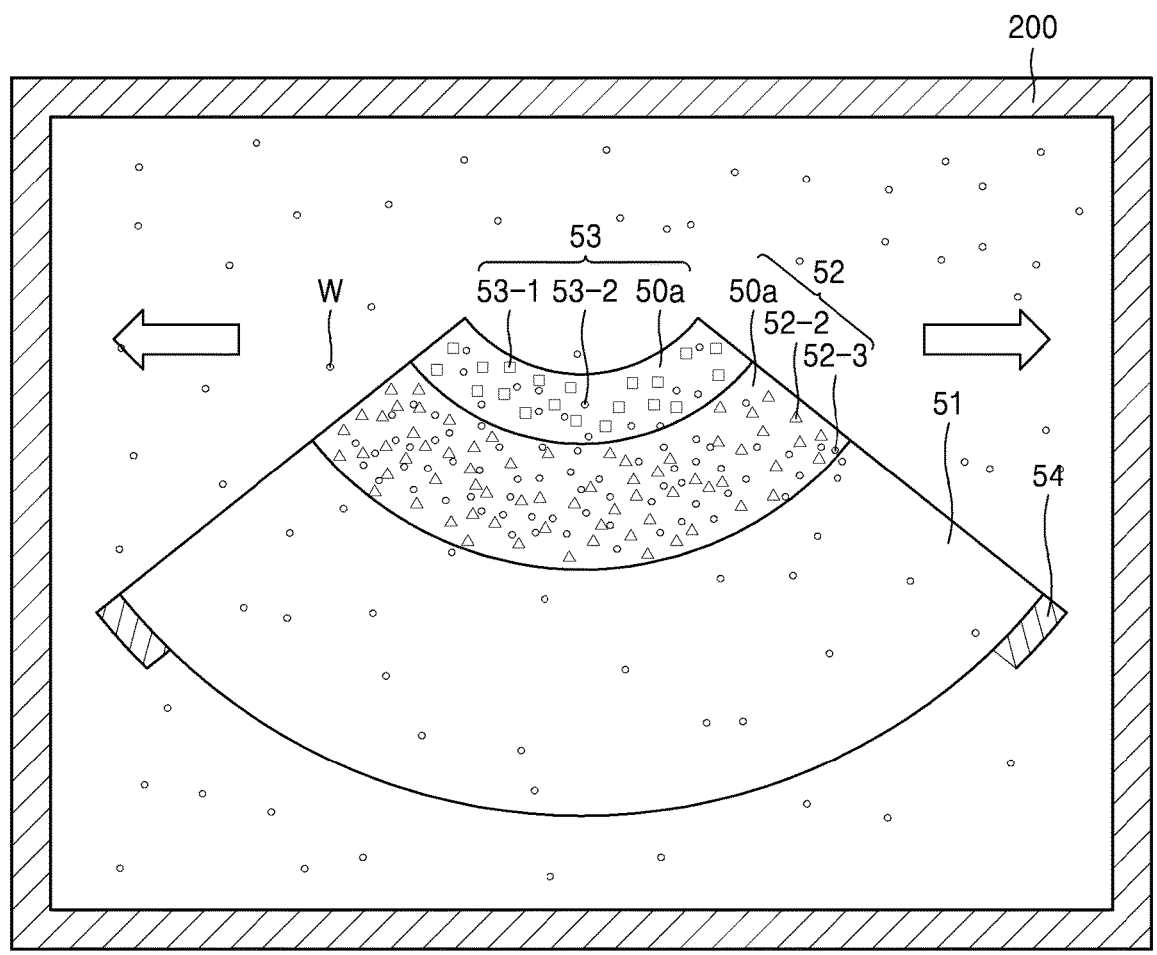

Referring to FIG. 7E, the substrate layer 51 on which the first coating layer 52 and the second coating layer 53 are arranged may be arranged inside a constant temperature and humidity chamber 200 to perform aging thereon. During the aging, the constant temperature and humidity chamber 200 may maintain an internal temperature (e.g., an aging temperature) at a constant temperature or within a set temperature range. Also, the constant temperature and humidity chamber 200 may maintain an internal humidity (e.g., an aging humidity) at a constant humidity or within a set humidity range. For example, the constant temperature and humidity chamber 200 may maintain an internal temperature in a range of 0° C. or more and 40° C. or less. Also, the constant temperature and humidity chamber 200 may maintain an internal relative humidity in a range of 80% or more and 100% or less.

When the substrate layer 51 on which the first coating layer 52 and the second coating layer 53 are arranged is arranged in the constant temperature and humidity chamber 200 as described above, a water molecule W inside the constant temperature and humidity chamber 200 may penetrate into the first coating layer 52, the second coating layer 53, and the substrate layer 51.

Figure 7F:
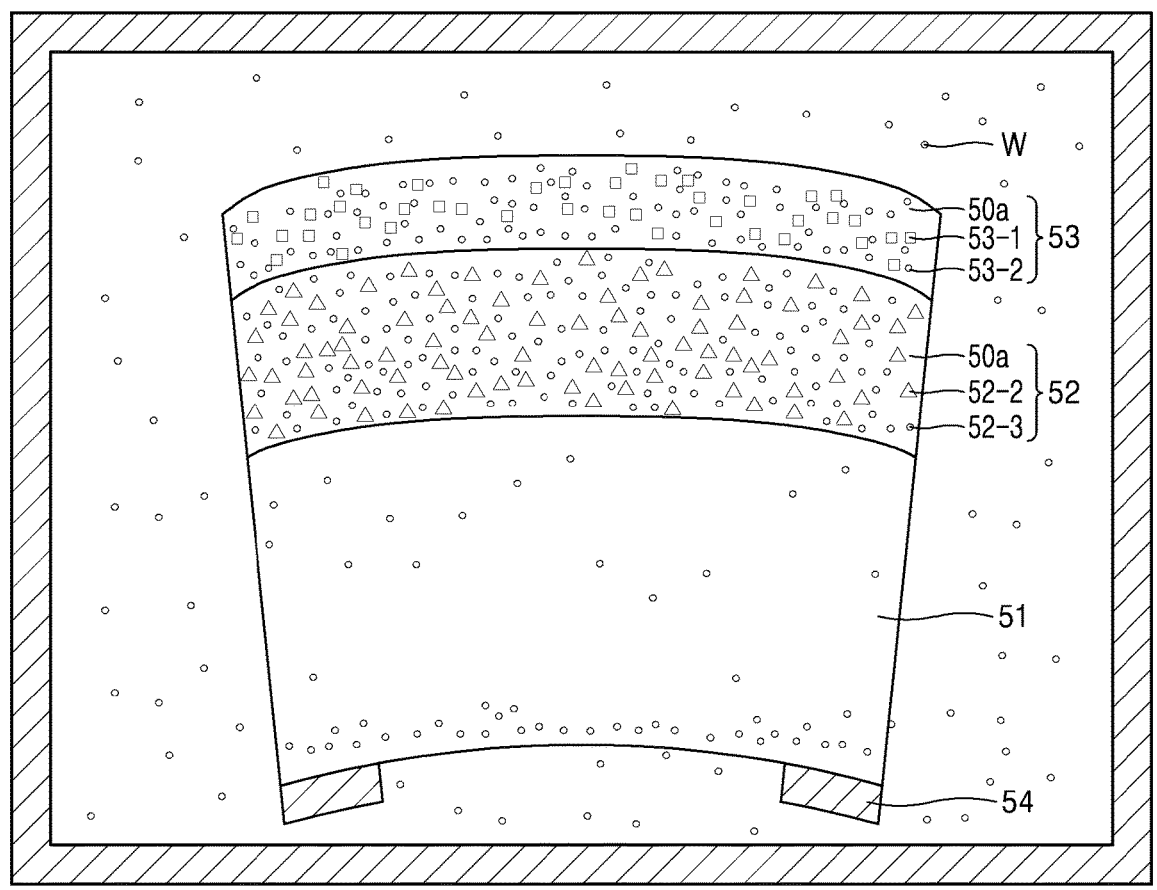

Referring to FIG. 7F, when the water molecule W penetrates into each of the first coating layer 52, the second coating layer 53, and the substrate layer 51, the water molecule W may be hydrogen-bonded with each of organic particles of the first coating layer 52, the second coating layer 53, and the substrate layer 51. In this case, the water molecule W is arranged between neighboring organic particles, and thus each of the organic particles and the water molecule W may be hydrogen bonded. In this case, because a distance between the neighboring organic particles is greater than before, warpage as shown in FIG. 7E may be removed to some extent. In particular, because the first coating layer 52, the second coating layer 53, and the substrate layer 51 are arranged in an environment where an internal relative humidity of the constant temperature and humidity chamber 200 is greater than or equal to 85%, a sufficient quantity of water molecules may penetrate into at least one of the first coating layer 52, the second coating layer 53, or the substrate layer 51. For example, the water molecule W may penetrate into the first coating layer 52 to become the first water molecule 52-3 of the first coating layer 52, and the water molecule W may penetrate into the second coating layer 53 to become the second water molecule 53-2 of the second coating layer 53.

The window 50 into which water molecules are penetrated as described above may be left unattended in the constant temperature and humidity chamber 200 for a period of 48 hours or more and 72 hours or less. In this case, temperature and relative humidity conditions inside the constant temperature and humidity chamber 200 may be maintained in the same manner as described above.

Figure 7G:
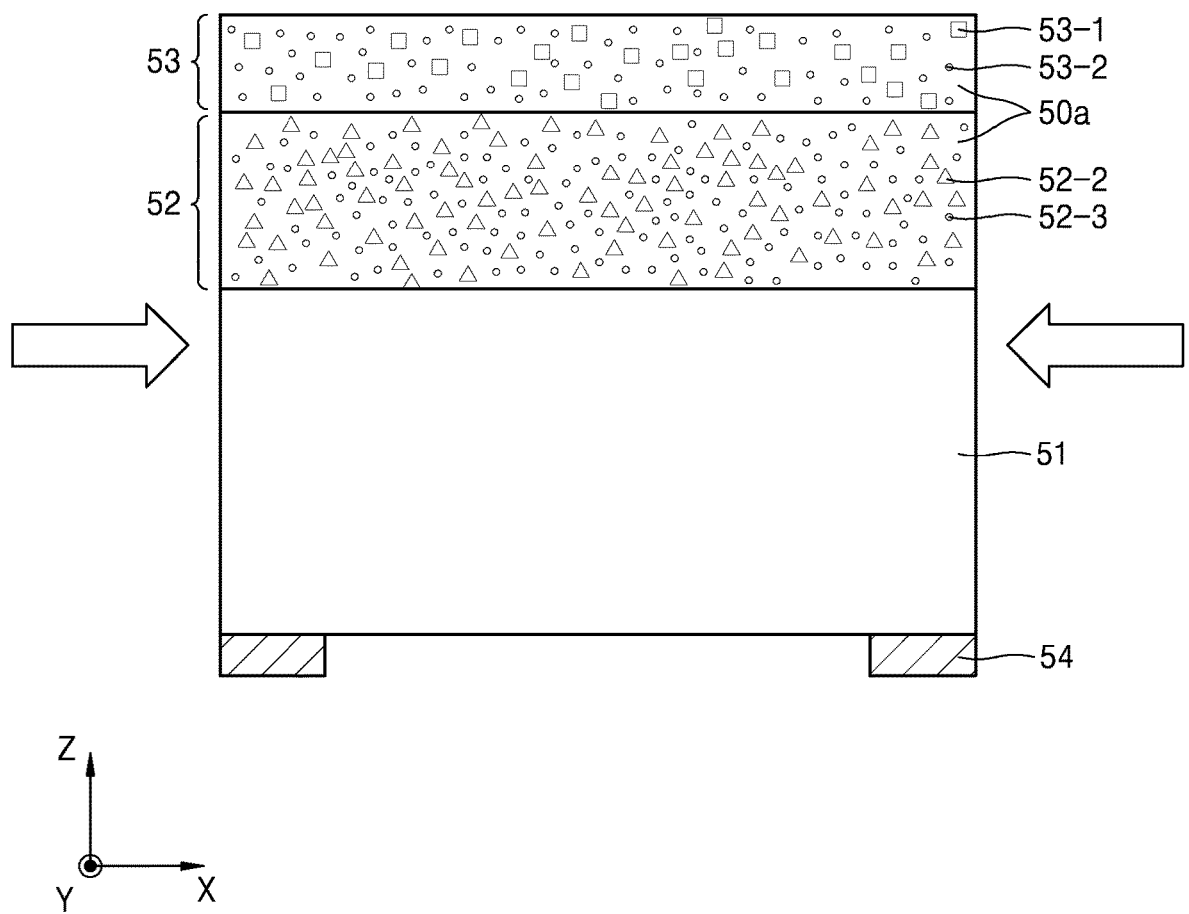

Referring to FIG. 7G, the window 50 arranged in the constant temperature and humidity chamber 200 may be drawn out of the constant temperature and humidity chamber 200 and may be arranged outside. In the window 50 arranged outside, the water molecule W included in at least one of the first coating layer 52, the second coating layer 53, or the substrate layer 51 may be leaked to the outside. In this case, the number of water molecules discharged from at least one of the first coating layer 52, the second coating layer 53, or the substrate layer 51 may vary according to the external humidity. For example, some of the first water molecules 52-3 may be arranged in the first coating layer 52, and some of the first water molecules 52-3 may be discharged to the outside of the first coating layer 52. Also, some of the second water molecules 53-2 may be arranged in the second coating layer 53, and some of the second water molecules 53-2 may be discharged to the outside of the second coating layer 53. In this above case, the hydrogen bond for some of water molecules hydrogen-bonded with organic particles of each coating layer is released, and thus they may be discharged to the outside of each coating layer.

As described above, because some of the first water molecules 52-3 deviate from the first coating layer 52, the first coating layer 52 shrinks, and thus the first coating layer 52 may be in a substantially flat state. Also, because some of the second water molecules 53-2 deviate from the second coating layer 53, the second coating layer 53 shrinks, and thus the second coating layer 53 may be in a substantially flat state.

Thus, the window 50 prepared as described above may maintain a flat surface. Also, the window 50 may suppress warpage occurring when the water molecule W is not included in at least one of the first coating layer 52 or the second coating layer 53.

Figure 8A:
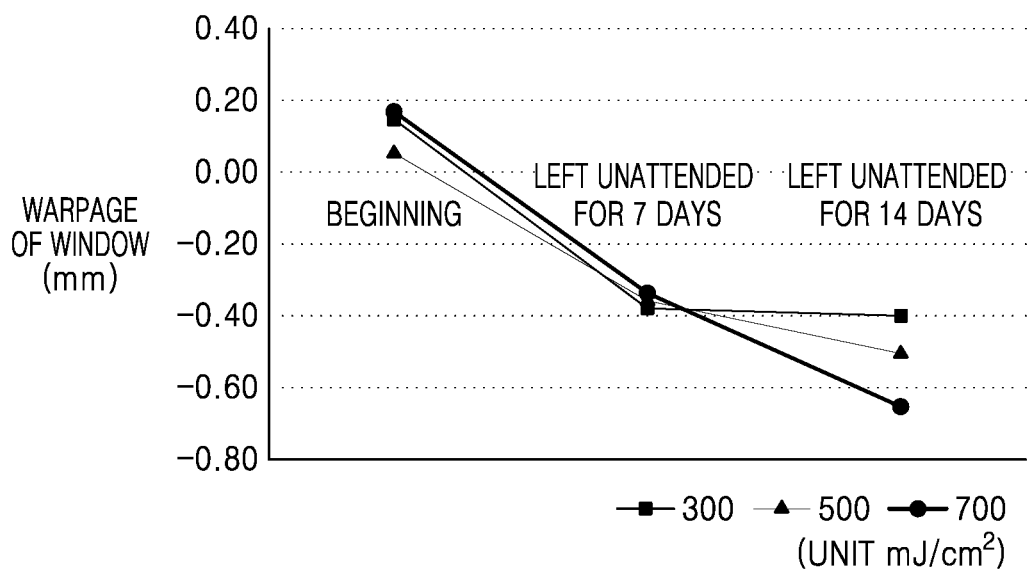
FIG. 8A is a graph showing warpage of a window according to a condition for precuring a first coating composition shown in FIG. 7B.

FIG. 8A is a graph showing warpage of a window according to a condition for precuring the first coating composition 52a shown in FIG. 7B. The window was drawn from a constant temperature and humidity chamber (e.g., under conditions of a temperature of 25° C., a humidity of 85%, and a time of 48 hr) and then left unattended in an external environment, and warpage of the window was measured.

The degree of warpage of the window may be defined as a distance at which an edge of the window is spaced from a plane correspond to a flat surface. The distance at which an edge of the window is spaced from a plane corresponding to a flat surface may refer to a height from a virtual flat surface contacting or corresponding to a center portion of the window where the warpage has occurred at an edge, which is most spaced apart, of the window. In this case, when the distance at which an edge of the window is spaced from the plane of the flat surface has a negative value, it refers to the edge of the window being arranged above the plane of the flat surface (e.g., the window is convex downward), and when the distance at which an edge of the window is spaced from the plane of the flat surface has a positive value, it refers to the edge of the window being arranged below the flat surface (e.g., the window is convex upward). To satisfy product reliability, the degree of warpage of the window should have a value in a range of −0.5 mm to +0.5 mm.

Referring to FIG. 8A, in a case where a UV irradiation amount is 700 mJ/cm$^2$ when precuring is performed as shown in FIG. 7B, it may be confirmed that warpage of the prepared window increases over time and exceeds −0.5 mm. On the contrary, in a case where a UV irradiation amount is 300 mJ/cm$^2$ or 500 mJ/cm$^2$, it may be confirmed that the warpage of time may be stabilized to some extent and the degree of warpage of the window is in a range of −0.5 mm to +0.5 mm.

Figure 8B:
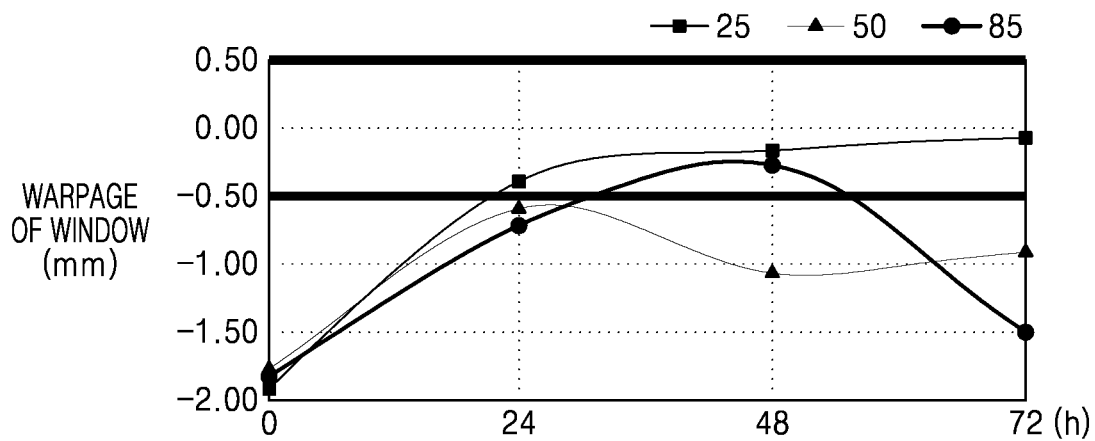
FIG. 8B is a graph showing warpage of a window according to the temperature inside a constant temperature and humidity chamber and the time at which the window is arranged in the constant temperature and humidity chamber.

FIG. 8B is a graph showing warpage of a window according to the temperature inside a constant temperature and humidity chamber and the time at which the window is arranged in the constant temperature and humidity chamber. The warpage of the window may be confirmed after the window is drawn from the constant temperature and humidity chamber.

A result shown in FIG. 8B is a result regarding warpage of the window when a humidity inside the constant temperature and humidity chamber was maintained at 85% and a temperature was set to 25° C., 50° C., or 85° C. Based on this, it may be seen that in a case where a temperature inside the constant temperature and humidity chamber is 25° C., as a time for the window arranged in the constant temperature and humidity chamber increases, the degree of warpage of the window gradually decreases and remains constant to some extent after 24 hours (24 h).

In a case where a temperature inside the constant temperature and humidity chamber is 50° C., although the degree of warpage of the window remains constant to some extent after 48 hours (48 h), the degree of the warpage of the window deviates from a desired level (e.g., a distance at which an edge of the window is spaced from a plane of a flat surface is in a range of −0.5 mm to +0.5 mm), and thus it may be difficult to use the window in the early stages when the window is manufactured.

In a case where a temperature inside the constant temperature and humidity chamber is 85° C., warpage of the window decreases over time and may increase after a certain period of time. That is, because the degree of warpage of the window is sensitive to time and difficult to control, it is easy to deviate from a desired level (e.g., a distance at which an edge of the window is spaced from a plane of a flat surface is in a range of −0.5 mm to +0.5 mm).

In a case where a window is warped a lot, when a window is manufactured and attached to a display panel to manufacture a display apparatus, the window may distort an image displayed on the display panel of the display apparatus or may cause distortion of the display apparatus.

Also, certain criteria should be satisfied in order to use a window in a display apparatus. For example, a yellowness index (YI) should be less than or equal to 1, a transmittance should be greater than or equal to 90, and adhesion should be high (e.g., as high as possible).

Table 1 shows physical properties of a window according to constant temperature and humidity chamber conditions.

TABLE 1

| Constant temperature and humidity chamber conditions | | | Adhesion | Optical characteristics | | Pencil hardness | Steel Wool |
|---|---|---|---|---|---|---|---|
| Temperature (° C.) | Humidity (%) | Time (hr) | 100/100 | Transmittance | YI | | |
| 85 | 85 | 24 | 91 | 90.89 | 1.20 | 8 H | 500 times |
| | | 48 | 92 | 90.94 | 1.27 | 8 H | 500 times |
| | | 72 | 90 | 90.97 | 1.45 | 8 H | 500 times |
| | | 96 | 93 | 90.95 | — | 8 H | 500 times |
| | | 120 | 94 | 90.94 | — | 8 H | 500 times |
| 50 | 85 | 24 | 90 | 90.99 | 1.01 | 8 H | 500 times |
| | | 48 | 96 | 90.98 | 1.05 | 8 H | 500 times |
| | | 72 | 98 | 91.01 | 1.06 | 8 H | 500 times |
| 25 | 85 | 24 | 95 | 90.98 | 0.96 | 8 H | 500 times |
| | | 48 | 95 | 90.99 | 0.97 | 8 H | 500 times |
| | | 72 | 100 | 91.00 | 0.97 | 8 H | 500 times |

In more detail, as shown in the above results, the light transmittance, adhesion, and YI may vary according to a temperature inside the constant temperature and humidity chamber. In this case, the light transmittance may be a transmittance of light passing through the window, the YI may be a degree of yellowish color from among colors of the window, and a degree of the adhesion may refer to a binding force between a first coating layer and a substrate layer. For example, a degree of the adhesion may be measured by counting the number of windows in which a first coating layer and a substrate layer are separated from each other when 100 windows are manufactured as specimens of a certain size and tape is attached to and detached from the specimens. When a degree of the adhesion is 95, it may refer to when 100 specimens are tested, a substrate layer and a first coating layer are separated from each other in windows of five of the specimens from among the 100 specimens. In order to be used as a window, a value should be approximately greater than or equal to 95.

The pencil hardness may refer to the hardness of a second coating layer arranged at the outermost of the window. The window may not be damaged by external impact when the pencil hardness is greater than or equal to 8 H under a load of 1 Kg. In Table 1, it may be confirmed that all the results have a pencil hardness of 8 H or more.

A steel wool test is a test to check the presence or absence of scratches after a surface of the second coating layer is rubbed using steel wool a certain number of times. In this case, when scratches are not formed on the second coating layer after 500 times of rubbing, the window may be used as a window for a display device. In all the results in Table 1, it may be confirmed that all of the steel wool tests are satisfied.

Based on the results of Table 1 and FIG. 8B, in a case where an internal temperature of the constant temperature and humidity chamber is 85° C., it may be confirmed that although the adhesion is satisfied to some extent, the YI is greater than 1. In this case, the color of the window is too close to yellow, which may cause problems with marketability or product reliability. Also, the degree of warpage of the window is sensitive to aging time, it is easy to be out of a range of −0.5 mm to +0.5 mm.

In a case where an internal temperature of the constant temperature and humidity chamber is 50° C., it may be confirmed that because the YI is close to 1, the window may be used to some extent for the display panel, and both the transmittance and the adhesion is high. The YI tends to increase to a certain degree as aging time increases. A degree of the adhesion may be about 95 or more when the aging is performed for 48 hours (h) or more. However, it may be seen that warpage of the window is somewhat out of a range of −0.5 mm to +0.5 mm.

In a case where an internal temperature of the constant temperature and humidity chamber is 25° C., it may be confirmed that the YI is less than 1, and both the transmittance and the adhesion are excellent. It may be confirmed that when the aging is performed for 24 hours or more, the warpage of the window is within a range of −0.5 mm to +0.5 mm.

Figure 8C:
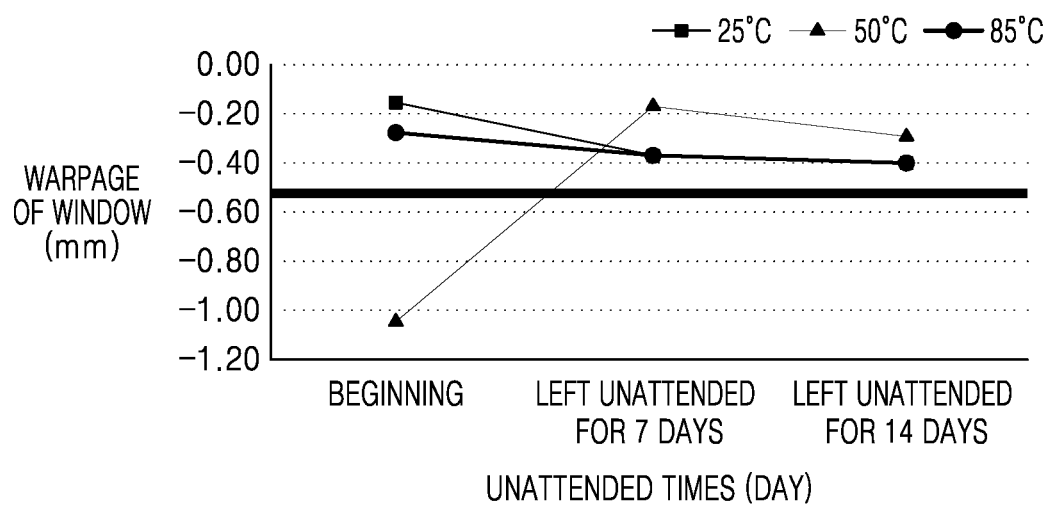
FIG. 8C is a graph showing a change in warpage of a window according to the temperature inside a constant temperature and humidity chamber and a period during which the window is arranged outside of the constant temperature and humidity chamber.

FIG. 8C is a graph showing a change in warpage of a window according to the temperature inside a constant temperature and humidity chamber and a period during which the window is arranged outside of the constant temperature and humidity chamber.

The window was arranged in the constant temperature and humidity chamber for 48 hours while a humidity inside the constant temperature and humidity chamber was maintained at 85% and a temperature was set to 25° C., 50° C., or 85° C., and then drawn out of the constant temperature and humidity chamber, and warpage of the window was measured.

Referring to FIG. 8C, the degree of warpage of the window varies according to the time the window is left outside, and the warpage of the window remains constant as the unattended time increases. That is, after approximately seven days are passed, warpage of the window in all cases may be within certain criteria (e.g., a distance at which an edge of the window is spaced from a plane of a flat surface is in a range of −0.5 mm to +0.5 mm). In this above case, even when the window is used, distortion of a display apparatus due to the window may not occur.

Figure 8D:
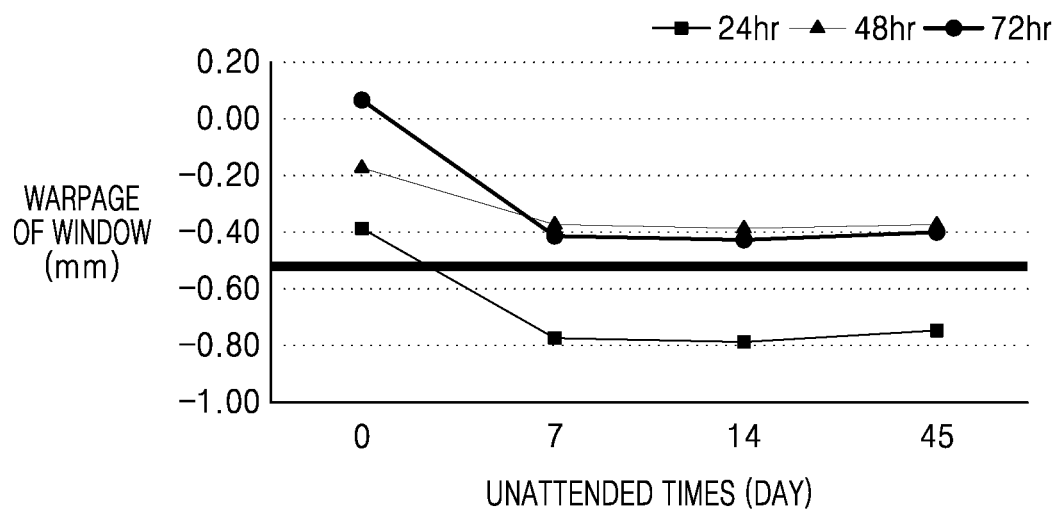
FIG. 8D is a graph showing a change in warpage of a window according to a time at which the window is arranged inside a constant temperature and humidity chamber and a period during which the window is arranged outside of the constant temperature and humidity chamber.

FIG. 8D is a graph showing a change in warpage of a window according to a time at which the window is arranged in a constant temperature and humidity chamber and a period during which the window is arranged outside of the constant temperature and humidity chamber. After aging for 24 hours (hr), 48 hours (hr), or 72 hours (hr) (i.e., one of these periods 24 hours, 48 hours, and 72 hours) while a humidity inside the constant temperature and humidity chamber was maintained at 85% and a temperature inside the constant temperature and humidity chamber is maintained at 25° C., the window was drawn out of the chamber, and warpage of the window was measured.

Referring to FIG. 8D, in a case of the window drawn out of the constant temperature and humidity chamber after aging for 24 hours, it may be confirmed that warpage of the window deviates from a certain reference range (e.g., a distance at which an edge of the window is spaced from a plane of a flat surface is in a range of −0.5 mm to +0.5 mm) over time. However, in a case where the window is arranged outside of the constant temperature and humidity chamber after aging for a period time within a range of 48 hours or more and 72 hours or less, it may be confirmed that even when time passes, warpage of the window is within a range of −0.5 mm to +0.5 mm and the warpage of the window is stabilized.

Table 2 shows physical properties of a window according to an aging time while a humidity of a constant temperature and humidity chamber is maintained at 85% and a temperature thereof is maintained at 25° C.

TABLE 2

| Aging time (hr) | Adhesion (100/100) | Hardness | YI | Steel Wool |
|---|---|---|---|---|
| 24 | 100 | 8 H | 0.96 | 500 times |
| 48 | 100 | 8 H | 0.97 | 500 times |
| 72 | 100 | 8 H | 0.97 | 500 times |

Referring to FIG. 2, it may be confirmed that, in all aging times, the window has high adhesion, a pencil hardness of 8 H, a transmittance of 90% or more, a YI of 1 or less, and excellent durability.

Meanwhile, the window on which an aging process was not performed in the constant temperature and humidity chamber may be warped a lot. For example, the warpage of the window before the aging process may be approximately 1.84 mm. On the contrary, the warpage of the window may be reduced when the aging process is performed. For example, when the window is arranged in the constant temperature and humidity chamber where an internal temperature is 25° C. and a humidity is 85% for 48 hours and then drawn out of the constant temperature and humidity chamber, the warpage of the window may be 0.16 mm. That is, when the window is arranged in the constant temperature and humidity chamber for a certain period of time, the warpage of the window may be reduced by approximately 90% or more. Therefore, as described above, by aging the window having a structure in which the first coating layer and the second coating layer are stacked (e.g., sequentially stacked) on the substrate layer, the warpage of the window may be made within a certain reference range, and even when the window is exposed to an external environment at room temperature, deformation of the window may be reduced.

Figure 9:
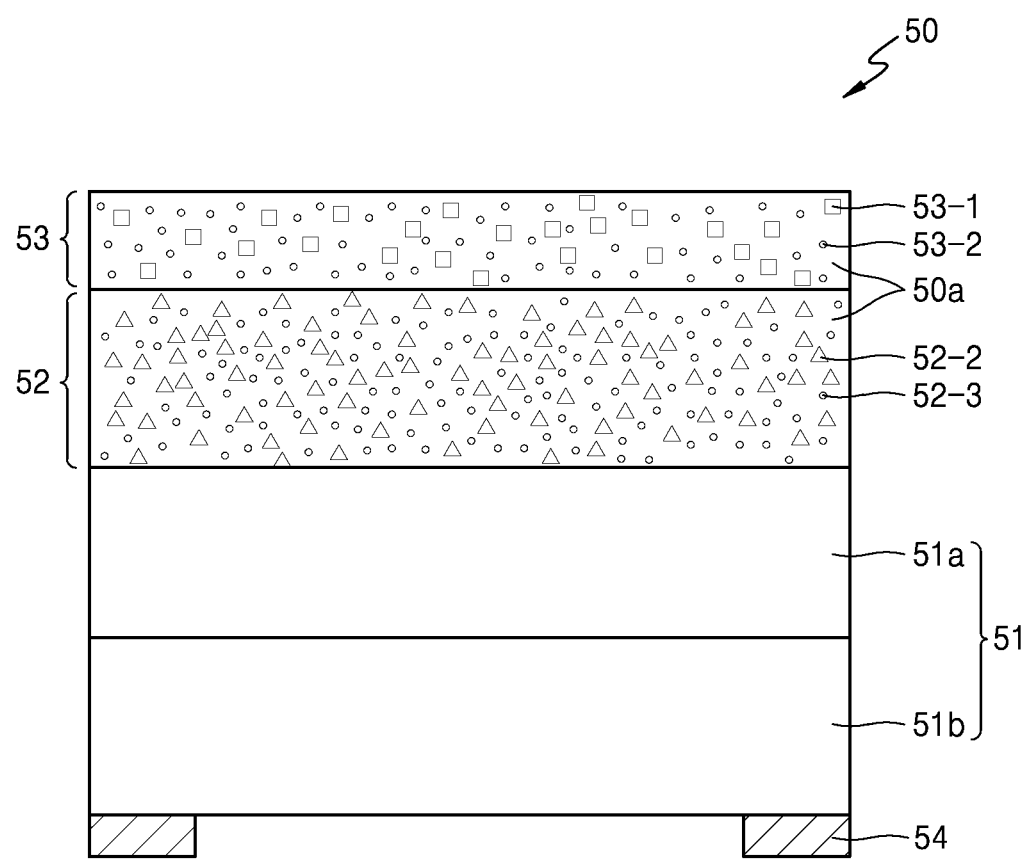
FIG. 9 is a cross-sectional view of a window of a display apparatus according to another embodiment.

FIG. 9 is a cross-sectional view of the window 50 of a display apparatus according to another embodiment.

Referring to FIG. 9, the window 50 may include the substrate layer 51, the first coating layer 52, the second coating layer 53, and the non-transparent layer 54. In this case, the first coating layer 52, the second coating layer 53, and the non-transparent layer 54 may be the same as or similar to those described above, and thus a detailed description may not be repeated.

The substrate layer 51 may include two layers. For example, the substrate layer 51 may include a stack of a first body layer 51a and a second body layer 51b. In this case, the first body layer 51a and the second body layer 51b may each include at least one of polycarbonate, polymethyl methacrylate, polyethylene terephthalate, polyimide, or poly-vinylidene fluoride. In this case, the first body layer 51a and the second body layer 51b may include the same material or may include different materials from each other.

The first body layer 51a may include the first coating layer. In this case, the first coating layer 52 may include the acrylic polymer 50a, the inorganic nanoparticle 52-2, the first water molecule 52-3, and an additive such as a photoinitiator. Also, the second coating layer 53 arranged on the first coating layer 52 may include the acrylic polymer 50a, the fluorine-based compound 53-1, the second water molecule 53-2, and an additive such as a photoinitiator. In this case, the acrylic polymer 50a may include a trifunctional acrylic monomer, and the trifunctional acrylic monomer may be the same or similar to that described in connection with FIG. 6.

Figure 10:
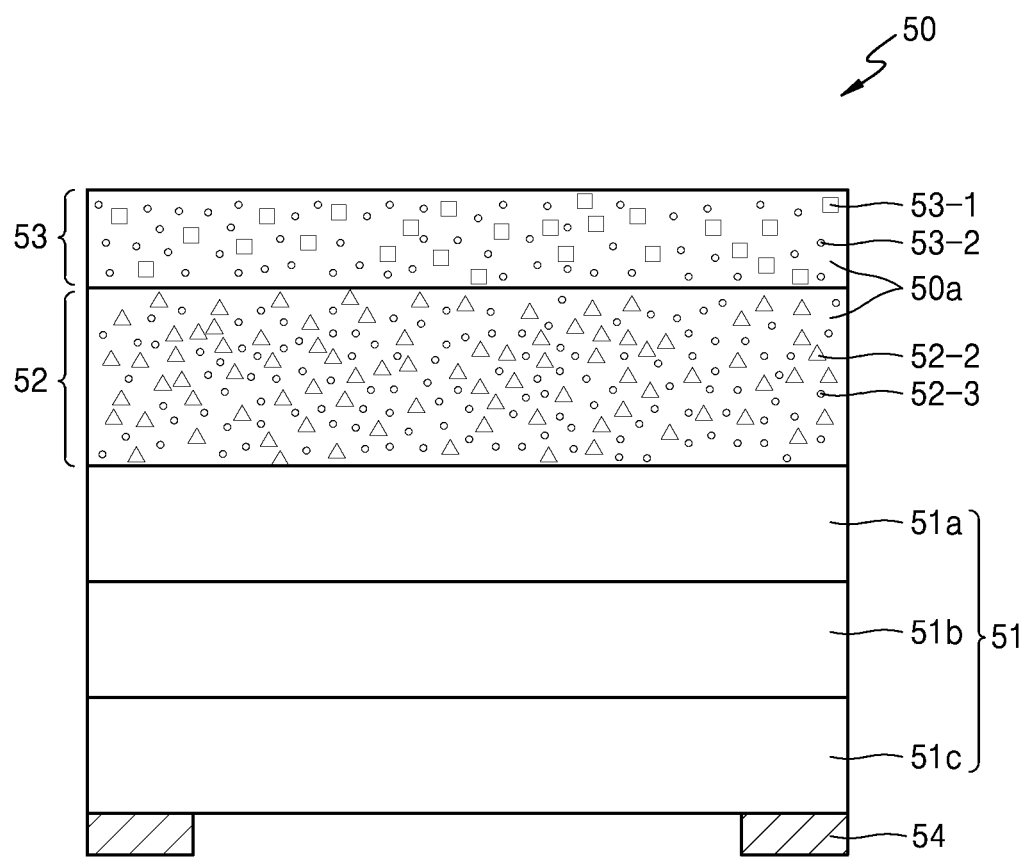
FIG. 10 is a cross-sectional view of a window of a display apparatus according to another embodiment.

FIG. 10 is a cross-sectional view of the window 50 of a display apparatus according to another embodiment.

Referring to FIG. 10, the window 50 may include the substrate layer 51, the first coating layer 52, the second coating layer 53, and the non-transparent layer 54. In this case, as described above, the first coating layer 52 may include the acrylic polymer 50a, the inorganic nanoparticle 52-2, the first water molecule 52-3, and an additive such as a photoinitiator. Also, the second coating layer 53 arranged on the first coating layer 52 may include the acrylic polymer 50a, the fluorine-based compound 53-1, the second water molecule 53-2, and an additive such as a photoinitiator.

The substrate layer 51 may include three layers. For example, the substrate layer 51 may include a stack of the first body layer 51a, the second body layer 51b, and a third body layer 51c. In this case, the first body layer 51a, the second body layer 51b, and the third body layer 51c may each include at least one of polycarbonate, polymethyl methacrylate, polyethylene terephthalate, polyimide, or poly-vinylidene fluoride. In this case, one of the first body layer 51a, the second body layer 51b, and the third body layer 51c may include the same material as or different materials from another one of the first body layer 51a, the second body layer 51b, and the third body layer 51c.

The window according to the embodiments may minimize or reduce warpage. Also, in the display apparatus according to the embodiments, a window with a flat surface is attached thereto, and thus an image may not be distorted. In the method of manufacturing a display apparatus according to the embodiments, a window that minimizes or reduces warpage may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A window comprising:
a substrate layer; and
a coating layer on the substrate layer,
the coating layer comprising water molecules, and
wherein the coating layer comprises:
a first coating layer on the substrate layer; and
a second coating layer on the first coating layer, the second coating layer formed by curing a second coating composition consisting of a trifunctional acrylic monomer, a fluorine-based compound, a solvent, and an optional photoinitiator.

2. The window of claim 1, wherein the first coating layer comprises an acrylic polymer comprising at least one of trimethylolpropane triacrylate, ethoxylated (3 mol) trimethylol propane triacrylate, ethoxylated (6 mol) trimethylol propane triacrylate, propoxylated (3 mol) trimethylol propane triacrylate (TMPTA), or pentaerythritol triacrylate (PETA).

3. The window of claim 1, wherein the first coating layer comprises inorganic nanoparticles.

4. The window of claim 1, wherein a thickness of the second coating layer is less than a thickness of the first coating layer.

5. The window of claim 1, wherein a thickness of the first coating layer is in a range of 30 μm or more and 40 μm or less.

6. The window of claim 1, wherein a thickness of the second coating layer is in a range of 1 μm or more and 10 μm or less.

7. The window of claim 1, wherein the substrate layer comprises a plurality of body layers stacked on each other.

8. The window of claim 1, wherein the substrate layer comprises at least one of polycarbonate, polymethyl methacrylate, polyethylene terephthalate, polyimide, or polyvinylidene fluoride.

9. The window of claim 1, wherein a transmittance of the window is 90% or more.

10. The window of claim 1, wherein a yellowness index of the window is 1 or less.

11. The window of claim 1, wherein warpage of the window is in a range of −0.5 mm to 0.5 mm.

12. A display apparatus comprising:
the window of claim 1; and
a display panel coupled to the window.

* * * * *